(12) United States Patent
Fox et al.

(10) Patent No.: US 11,522,235 B1
(45) Date of Patent: Dec. 6, 2022

(54) BATTERY SYSTEMS FOR USE WITH TELEMATICS

(71) Applicant: Geotab Inc., Oakville (CA)

(72) Inventors: Stephen Michael Fox, Oakville (CA); Samuel Zhao, Oakville (CA)

(73) Assignee: Geotab Inc., Oakville (CA)

( * ) Notice: Subject to any disclaimer, the term of this patent is extended or adjusted under 35 U.S.C. 154(b) by 0 days.

(21) Appl. No.: 17/739,543

(22) Filed: May 9, 2022

Related U.S. Application Data

(60) Provisional application No. 63/196,908, filed on Jun. 4, 2021.

(51) Int. Cl.
  *G01R 31/3835* (2019.01)
  *H01M 10/48* (2006.01)

(52) U.S. Cl.
  CPC ...... *H01M 10/482* (2013.01); *G01R 31/3835* (2019.01); *H01M 2220/20* (2013.01)

(58) Field of Classification Search
  CPC ............ H01M 10/482; H01M 2220/20; G01R 31/3835
  See application file for complete search history.

(56) References Cited

U.S. PATENT DOCUMENTS

| | | | |
|---|---|---|---|
| 5,182,546 A | 1/1993 | Shinbori | |
| 5,717,309 A | 2/1998 | Cho | |
| 5,771,471 A | 6/1998 | Alberth, Jr. | |
| 7,474,942 B2 | 1/2009 | Patenaude | |
| 9,872,225 B2 | 1/2018 | Guba | |
| 11,210,872 B1 | 12/2021 | Wong | |
| 2002/0032510 A1 | 3/2002 | Turnbull | |
| 2002/0091955 A1 | 7/2002 | Christopher | |
| 2003/0231550 A1 | 12/2003 | MacFarlane | |
| 2004/0075345 A1 | 4/2004 | Yoshioka | |
| 2007/0041261 A1 | 2/2007 | Oku | |
| 2009/0121930 A1 | 5/2009 | Bennett | |
| 2009/0284391 A1 | 11/2009 | Berkobin | |
| 2010/0323657 A1 | 12/2010 | Barnard | |
| 2011/0062777 A1 | 3/2011 | Sotnikow | |
| 2011/0118934 A1 | 5/2011 | Lowrey | |
| 2011/0163771 A1 | 7/2011 | Kojima | |
| 2011/0279089 A1 | 11/2011 | Yeo | |
| 2012/0026010 A1 | 2/2012 | Owens | |
| 2012/0052836 A1 | 3/2012 | Buratti | |
| 2017/0285712 A1 | 10/2017 | Veloso | |
| 2020/0274375 A1 | 8/2020 | Griffiths | |

(Continued)

*Primary Examiner* — Victoria H Lynch
(74) *Attorney, Agent, or Firm* — Mark J. Pringle-Rigby

(57) ABSTRACT

Vehicles can employ onboard telematic monitoring devices to collect vehicle and operation data, such as for improved vehicle fleet management. Such telematic monitoring devices are dependent on power from a vehicle, such that data collection and communication can be interrupted if a telematic monitoring device is disconnected or has a poor connection. The present disclosure relates to battery devices, which provide power to telematic monitoring devices as needed in order to maintain data collection and communication, or other more limited functionality. The present disclosure also relates to systems including battery devices, and methods for operating battery devices. The present disclosure also relates to detecting temperature of batteries, as well as emergency input and messages for telematic monitoring systems.

6 Claims, 8 Drawing Sheets

(56) References Cited

U.S. PATENT DOCUMENTS

2021/0183228 A1  6/2021  Yun
2021/0237670 A1  8/2021  Takahara
2022/0111732 A1* 4/2022  He .......................... B60L 58/12

* cited by examiner

BATTERY SYSTEMS FOR USE WITH TELEMATICS

PRIOR APPLICATION DATA

This application claims priority to U.S. Provisional Patent Application No. 63/196,908 titled "Battery Devices, Systems, and Methods for Use with Telematics", filed on Jun. 4, 2021.

TECHNICAL FIELD

The present disclosure generally relates to battery devices, systems which include battery devices, and methods for using battery devices, and in particular relates to providing and operating battery backup devices in telematics systems.

BACKGROUND

Telematics systems have been employed by fleet owners to monitor use and performance of vehicles in the fleet. While this has resulted in improved performance and maintenance of vehicles in the fleet, such telematics systems are dependent on power from vehicles.

SUMMARY

According to a broad aspect, the present disclosure describes a system comprising: a telematic monitoring device capable of obtaining data and power from a vehicle; a battery device electrically coupled to the telematic monitoring device, the battery device including control circuitry and at least one battery, the battery device operable in a plurality of modes including at least: a first mode where the battery device receives power from the vehicle, and provision of power to the at least one battery is enabled to charge the at least one battery; a second mode where the battery device receives power from the vehicle, and provision of power to the at least one battery is disabled; a third mode where the battery device does not receive power from the vehicle, the battery device provides power to the telematic monitoring device, and provision of power to the at least one battery is disabled; and wherein the control circuitry of the battery device is operable to select a mode of operation of the battery device from the plurality of modes, the control circuitry to cause the battery device to: operate in the first mode when the vehicle is on and the telematic monitoring device is electrically coupled to the vehicle; operate in the second mode when the vehicle is off and the telematic monitoring device is electrically coupled to the vehicle; and operate in the third mode when the telematic monitoring device is not electrically coupled to the vehicle.

In the third mode the battery device may provide a first quantity of power to the telematic monitoring device to operate the telematic monitoring device in a full power mode; the control circuitry may be operable to cause the battery device to operate in the third mode when the telematic monitoring device is not electrically coupled to the vehicle and: the vehicle is in motion or the vehicle is on; the plurality of modes in which the battery device is operable may further include a fourth mode where the battery device does not receive power from the vehicle, provision of power to the at least one battery is disabled, and the battery device provides a second quantity of power to the telematic monitoring device lower than the first quantity of power, to operate the telematic monitoring device in a low power mode which consumes less power than the full power mode; and the control circuitry may be operable to cause the battery device to operate in the fourth mode when the telematic monitoring device is not coupled to the vehicle and: the vehicle is not in motion or the vehicle is off.

In the full power mode the telematic monitoring device may be in an active state where data is processed and sent over a communication network; and in the low power mode the telematic monitoring device may be in a sleep state, and periodically enter a wake state to check whether there is new data to be sent over the communication network.

The plurality of modes may include a fifth mode where provision of power from the at least one battery is disabled; and the control circuitry of the battery device may be operable to cause the battery device to operate in the fifth mode when the battery device is disconnected from the telematic monitoring device. The system may further comprise at least one peripheral device electrically coupled to the battery device, wherein: in the first mode, provision of power from the battery device to the at least one peripheral device is enabled; in the second mode, provision of power from the battery device to the at least one peripheral device is enabled; in the third mode, provision of power from the battery device to the at least one peripheral device is disabled; in the fourth mode, provision of power from the battery device to the at least one peripheral device is disabled; and in the fifth mode, provision of power from the battery device to the at least one peripheral device is disabled.

The system may further comprise at least one peripheral device electrically coupled to the battery device, wherein: in the first mode, provision of power from the battery device to the at least one peripheral device is enabled; in the second mode, provision of power from the battery device to the at least one peripheral device is enabled; and in the third mode, provision of power from the battery device to the at least one peripheral device is disabled.

The plurality of modes may include a fourth mode where provision of power from the at least one battery is disabled; and the control circuitry of the battery device may be operable to cause the battery device to operate in the fourth mode when the battery device is disconnected from the telematic monitoring device.

The control circuitry of the battery device may be operable to detect whether the vehicle is on.

The control circuitry may be operable to detect whether the vehicle is on based on data selected from the group consisting of: ignition data from the telematic monitoring device which indicates a state of an ignition of the vehicle; voltage measurement data which indicates a voltage level of power from the vehicle, indicative of whether the vehicle is on; voltage measurement data which indicates a voltage level of power from the vehicle, indicative of voltage fluctuations caused by an ignition event of the vehicle; acceleration data from an accelerometer or inertial measurement unit (IMU) of the telematic monitoring device which indicates the vehicle is vibrating; and audio data from an audio sensor of the telematic monitoring device which includes a representation of an engine noise of the vehicle. The system may further comprise at least one peripheral device electrically coupled to the battery device, wherein the control circuitry is operable to detect whether the vehicle is on based on data selected from the group consisting of: acceleration data from an accelerometer or inertial measurement unit (IMU) of the at least one peripheral device which indicates the vehicle is vibrating; and audio data from an audio sensor of the at least one peripheral device which includes a representation of an engine noise of the vehicle.

A processing unit in the telematic monitoring device may be operable to detect whether the vehicle is on based on data selected from the group consisting of: ignition data from the vehicle which indicates a state of an ignition of the vehicle; voltage measurement data which indicates a voltage level of power from the vehicle, indicative of whether the vehicle is on; voltage measurement data which indicates a voltage level of power from the vehicle, indicative of voltage fluctuations caused by an ignition event of the vehicle; acceleration data from an accelerometer or inertial measurement unit (IMU) of the telematic monitoring device which indicates the vehicle is vibrating; and audio data from an audio sensor of the telematic monitoring device which includes a representation of an engine noise of the vehicle, and the telematic monitoring device may be operable to send a signal to the battery device indicating whether the vehicle is on.

The system may further comprise at least one peripheral device electrically coupled to the battery device, wherein a processing unit in the at least one peripheral device is operable to detect whether the vehicle is on based on data selected from the group consisting of: acceleration data from an accelerometer or inertial measurement unit (IMU) of the at least one peripheral device which indicates the vehicle is vibrating; and audio data from an audio sensor of the at least one peripheral device which includes a representation of an engine noise of the vehicle, and the at least one peripheral device may be operable to send a signal to the battery device indicating whether the vehicle is on.

The control circuitry of the battery device may be operable to detect whether the vehicle is in motion.

The control circuitry may be operable to detect whether the vehicle is in motion based on data selected from the group consisting of: positional data from a location sensor of the telematic monitoring device which indicates a change in position or a movement speed of the vehicle; acceleration data from an accelerometer or inertial measurement unit (IMU) of the telematic monitoring device which indicates acceleration of the vehicle; audio data from an audio sensor of the telematic monitoring device which includes a representation of movement noise of the vehicle; and image data from an image sensor of the telematic monitoring device which includes a representation of a changing environment of the vehicle.

The system may further comprise at least one peripheral device electrically coupled to the battery device, wherein the control circuitry is operable to detect whether the vehicle is in motion based on data selected from the group consisting of: positional data from a location sensor of the at least one peripheral device which indicates a change in position or a movement speed of the vehicle; acceleration data from an accelerometer or inertial measurement unit (IMU) of the at least one peripheral device which indicates acceleration of the vehicle; audio data from an audio sensor of the at least one peripheral device which includes a representation of movement noise of the vehicle; and image data from an image sensor of the at least one peripheral device which includes a representation of a changing environment of the vehicle.

A processing unit in the telematic monitoring device may be operable to detect whether the vehicle is in motion based on data selected from the group consisting of: positional data from a location sensor of the telematic monitoring device which indicates a change in position or a movement speed of the vehicle; acceleration data from an accelerometer or inertial measurement unit (IMU) of the telematic monitoring device which indicates acceleration of the vehicle; audio data from an audio sensor of the telematic monitoring device which includes a representation of movement noise of the vehicle; and image data from an image sensor of the telematic monitoring device which includes a representation of a changing environment of the vehicle, and the telematic monitoring device may be operable to send a signal to the battery device indicating whether the vehicle is in motion.

The system may further comprise at least one peripheral device electrically coupled to the battery device, wherein a processing unit in the at least one peripheral device is operable to detect whether the vehicle is in motion based on data selected from the group consisting of: positional data from a location sensor of the at least one peripheral device which indicates a change in position or a movement speed of the vehicle; acceleration data from an accelerometer or inertial measurement unit (IMU) of the at least one peripheral device which indicates acceleration of the vehicle; audio data from an audio sensor of the at least one peripheral device which includes a representation of movement noise of the vehicle; and image data from an image sensor of the at least one peripheral device which includes a representation of a changing environment of the vehicle, further wherein the at least one peripheral device is operable to send a signal to the battery device indicating whether the vehicle is on.

The telematic monitoring device may be operable to output a signal indicative of disconnection in response to the telematic monitoring device being disconnected from the vehicle. The signal indicative of disconnection may be an audible sound. The signal indicative of disconnection may be an electronic signal communicated over a communication network.

The control circuitry of the battery device may be operable to: detect when power to the battery device is disconnected; detect whether the battery device is electrically coupled to the telematic monitoring device; and instruct the telematic monitoring device to transmit a signal indicative of disconnection of power when power to the battery device is disconnected and the battery device is electrically coupled to the telematic monitoring device.

Power received by the battery device from the vehicle may be received via the telematic monitoring device.

The battery device may comprise power circuitry for provisioning power within the battery device. The power circuitry may further provision power input to and output from the battery device.

The control circuitry may be operable to select a mode of operation based on at least data selected from the group consisting of: vehicle data provided to the battery device through the telematic monitoring device; sensor data from at least one sensor of the telematic monitoring device; instruction data from the telematic monitoring device; and sensor data from sensors of the battery device.

According to another broad aspect, the present disclosure describes a battery device comprising: control circuitry; at least one battery; wherein the battery device is electrically couplable to a telematic monitoring device capable of obtaining data and power from a vehicle, and the battery device is operable in a plurality of modes including at least: a first mode where the battery device receives power from the vehicle, and provision of power to the at least one battery is enabled to charge the at least one battery; a second mode where the battery device receives power from the vehicle, and provision of power to the at least one battery is disabled; a third mode where the battery device provides power to the telematic monitoring device, and charging of the at least one battery is disabled; and wherein the control circuitry is operable to cause the battery device to: operate in the first mode when the vehicle is on and the telematic monitoring device is electrically coupled to the vehicle; operate in the second mode when the vehicle is off and the telematic monitoring device is electrically coupled to the vehicle; and operate in the third mode when the telematic monitoring device is not electrically coupled to the vehicle.

In the third mode the battery device may provide a first quantity of power to the telematic monitoring device to operate the telematic monitoring device in a full power mode; the control circuitry may be operable to cause the battery device to operate in the third mode when the telematic monitoring device is not electrically coupled to the vehicle and: the vehicle is in motion or the vehicle is on; the plurality of modes in which the battery device is operable may further include a fourth mode where the battery device does not receive power from the vehicle, provision of power to the at least one battery is disabled, and the battery device provides a second quantity of power to the telematic monitoring device lower than the first quantity of power, to operate the telematic monitoring device in a low power mode which consumes less power than the full power mode; and the control circuitry may be operable to cause the battery device to operate in the fourth mode when the telematic monitoring device is not coupled to the vehicle and: the vehicle is not in motion or the vehicle is off.

In the full power mode the telematic monitoring device may be in an active state where data is processed and sent over a communication network, the first quantity of power to operate the telematic monitoring device in the active state; and in the low power mode the telematic monitoring device may be in a sleep state, and periodically enter a wake state to check whether there is new data to be sent over the communication network, the second quantity of power to operate the telematic monitoring device in the sleep state and the wake state.

The plurality of modes may include a fifth mode where provision of power from the at least one battery is disabled; and the control circuitry of the battery device may be operable to cause the battery device to operate in the fifth mode when the battery device is disconnected from the telematic monitoring device.

The battery device may be electrically couplable to at least one peripheral device; in the first mode, provision of power from the battery device to the at least one peripheral device may be enabled; in the second mode, provision of power from the battery device to the at least one peripheral device may be enabled; in the third mode, provision of power from the battery device to the at least one peripheral device may be disabled; in the fourth mode, provision of power from the battery device to the at least one peripheral device may be disabled; and in the fifth mode, provision of power from the battery device to the at least one peripheral device may be disabled.

The battery device may be electrically couplable to at least one peripheral device; in the first mode, provision of power from the battery device to the at least one peripheral device may be enabled; in the second mode, provision of power from the battery device to the at least one peripheral device may be enabled; and in the third mode, provision of power from the battery device to the at least one peripheral device may be disabled.

The plurality of modes may include a fourth mode where provision of power from the at least one battery is disabled; and the control circuitry of the battery device may be operable to cause the battery device to operate in the fourth mode when the battery device is disconnected from the telematic monitoring device.

The control circuitry of the battery device may be operable to detect whether the vehicle is on.

The control circuitry may be operable to detect whether the vehicle is on based on data selected from the group consisting of: ignition data from the telematic monitoring device which indicates a state of an ignition of the vehicle; voltage measurement data which indicates a voltage level of power from the vehicle, indicative of whether the vehicle is on; voltage measurement data which indicates a voltage level of power from the vehicle, indicative of voltage fluctuations caused by an ignition event of the vehicle; acceleration data from an accelerometer or inertial measurement unit (IMU) of the telematic monitoring device which indicates the vehicle is vibrating; audio data from an audio sensor of the telematic monitoring device which includes a representation of an engine noise of the vehicle; and status data generated by a processing unit of the telematic monitoring device which indicates whether the vehicle is on.

The battery device may be electrically couplable to at least one peripheral device; and the control circuitry may be operable to detect whether the vehicle is on based on data selected from the group consisting of: acceleration data from an accelerometer or inertial measurement unit (IMU) of the at least one peripheral device which indicates the vehicle is vibrating; audio data from an audio sensor of the at least one peripheral device which includes a representation of an engine noise of the vehicle; and status data generated by a processing unit of the at least one peripheral device which indicates whether the vehicle is on.

The control circuitry of the battery device may be operable to detect whether the vehicle is in motion.

The control circuitry may be operable to detect whether the vehicle is in motion based on data selected from the group consisting of: positional data from a location sensor of the telematic monitoring device which indicates a change in position or a movement speed of the vehicle; acceleration data from an accelerometer or inertial measurement unit (IMU) of the telematic monitoring device which indicates acceleration of the vehicle; audio data from an audio sensor of the telematic monitoring device which includes a representation of movement noise of the vehicle; image data from an image sensor of the telematic monitoring device which includes a representation of a changing environment of the vehicle; and status data generated by a processing unit of the telematic monitoring device which indicates whether the vehicle is in motion.

The battery device may be electrically couplable to at least one peripheral device; and the control circuitry may be operable to detect whether the vehicle is in motion based on data selected from the group consisting of: positional data from a location sensor of the at least one peripheral device which indicates a change in position or a movement speed of the vehicle; acceleration data from an accelerometer or inertial measurement unit (IMU) of the at least one peripheral device which indicates acceleration of the vehicle; audio data from an audio sensor of the at least one peripheral device which includes a representation of movement noise of the vehicle; image data from an image sensor of the at least one peripheral device which includes a representation of a changing environment of the vehicle; and status data generated by a processing unit of the at least one peripheral device which indicates whether the vehicle is in motion.

The battery device may be operable to output a signal indicative of disconnection in response to the telematic monitoring device being disconnected from the vehicle. The battery device may further comprise an audio output device to output the signal indicative of disconnection as an audible sound. The battery device may further comprise a communication interface to output the signal indicative of disconnection as an electronic signal communicated over a communication network.

The control circuitry of the battery device may be operable to: detect when power to the battery device is disconnected; detect whether the battery device is communicatively coupled to the telematic monitoring device; and instruct the telematic monitoring device to transmit a signal indicative of disconnection of power when power to the battery device is disconnected and the battery device is coupled to the telematic monitoring device.

The battery device may be further operable to receive power from the vehicle via the telematic monitoring device.

The battery device may comprise power circuitry for provisioning power within the battery device. The power circuitry may further provision power input to and output from the battery device.

The control circuitry may be operable to select a mode of operation of the battery device based on at least data selected from the group consisting of: vehicle data provided to the battery device through the telematic monitoring device; sensor data from at least one sensor of the telematic monitoring device; instruction data from the telematic monitoring device; and sensor data from sensors of the battery device.

According to yet another broad aspect, the present disclosure describes a method for operating a battery device comprising control circuitry and at least one battery, wherein the battery device is electrically couplable to a telematic monitoring device capable of obtaining data and power from a vehicle, the method comprising: selecting, by the control circuitry, a select mode of operation for the battery device from a plurality of modes in which the battery device is operable, including: selecting a first mode of the plurality of modes as the select mode when the vehicle is on and the telematic monitoring device is electrically coupled to the vehicle; selecting a second mode of the plurality of modes as the select mode when the vehicle is off and the telematic monitoring device is electrically coupled to the vehicle; and selecting a third mode of the plurality of modes as the select mode when the telematic monitoring device is not electrically coupled to the vehicle; and operating, by the control circuitry, the battery device in the select mode, wherein: when the first mode is the select mode, the battery device receives power from the vehicle, and provision of power to the at least one battery is enabled; when the second mode is the select mode, the battery device receives power from the vehicle, and provision of power to the at least one battery is enabled; and when the third mode is the select mode, the battery device provides power from the at least one battery to the telematic monitoring device, and provision of power to the at least one battery is disabled.

Selecting the third mode may comprise selecting the third mode when the telematic monitoring device is not electrically coupled to the vehicle and: the vehicle is in motion or the vehicle is on; when the third mode is the select mode, the battery device may provide a first quantity of power from the at least one battery to the telematic monitoring device, for the telematic monitoring device to operate in a full power mode; selecting a select mode of operation for the battery device from a plurality of modes in which the battery device is operable may further include: selecting a fourth mode of the plurality of modes as the select mode when the telematic monitoring device is not coupled to the vehicle and: the vehicle is not in motion or the vehicle is off; and when the fourth mode is the select mode, provision of power to the at least one battery may be disabled, and the battery device may provide a second quantity of power to the telematic monitoring device lower than the first quantity of power, to operate the telematic monitoring device in a low power mode which consumes less power than the full power mode.

In the full power mode the telematic monitoring device may be in an active state where data is processed and sent over a communication network, the first quantity of power provided to operate the telematic monitoring device in the active state; and in the low power mode the telematic monitoring device may be in a sleep state, and periodically enter a wake state to check whether there is new data to be sent over the communication network, the second quantity of power provided to operate the telematic monitoring device in the sleep state and the wake state.

Selecting a select mode of operation for the battery device from a plurality of modes in which the battery device is operable may further include: selecting a fifth mode of the plurality of modes as the select mode when the battery device is disconnected from the telematic monitoring device; and when the fifth mode is the select mode, provision of power from the at least one battery may be disabled.

The battery device may be electrically coupled to at least one peripheral device; when the first mode is the select mode, provision of power from the battery device to the at least one peripheral device may be enabled; when the second mode is the select mode, provision of power from the battery device to the at least one peripheral device may be enabled; when the third mode is the select mode, provision of power from the battery device to the at least one peripheral device may be disabled; when the fourth mode is the select mode, provision of power from the battery device to the at least one peripheral device may be disabled; and when the fifth mode is the select mode, provision of power from the battery device to the at least one peripheral device may be disabled.

The battery device may be electrically coupled to at least one peripheral device; when the first mode is the select mode, provision of power from the battery device to the at least one peripheral device may be enabled; when the second mode is the select mode, provision of power from the battery device to the at least one peripheral device may be enabled; and when the third mode is the select mode, provision of power from the battery device to the at least one peripheral device may be disabled.

Selecting a select mode of operation for the battery device from a plurality of modes in which the battery device is operable may further include: selecting a fourth mode of the plurality of modes as the select mode when the battery device is disconnected from the telematic monitoring device; and when the fourth mode is the select mode, provision of power from the at least one battery may be disabled.

The method may further comprise detecting, by the control circuitry, whether the vehicle is on.

Detecting, by the control circuitry, whether the vehicle is on may be based on data selected from the group consisting of: ignition data from the telematic monitoring device which indicates a state of an ignition of the vehicle; voltage measurement data which indicates a voltage level of power from the vehicle, indicative of whether the vehicle is on; voltage measurement data which indicates a voltage level of power from the vehicle, indicative of voltage fluctuations caused by an ignition event of the vehicle; acceleration data from an accelerometer or inertial measurement unit (IMU) of the telematic monitoring device which indicates the vehicle is vibrating; audio data from an audio sensor of the telematic monitoring device which includes a representation of an engine noise of the vehicle; and status data generated by a processing unit of the telematic monitoring device which indicates whether the vehicle is on.

The battery device may be electrically coupled to at least one peripheral device; detecting, by the control circuitry, whether the vehicle is on may be based on data selected from the group consisting of: acceleration data from an accelerometer or inertial measurement unit (IMU) of the at least one peripheral device which indicates the vehicle is vibrating; audio data from an audio sensor of the at least one peripheral device which includes a representation of an engine noise of the vehicle; and status data generated by a processing unit of the at least one peripheral device which indicates whether the vehicle is on.

The method may further comprise detecting, by the control circuitry, whether the vehicle is in motion.

Detecting, by the control circuitry, whether the vehicle is in motion may be based on data selected from the group consisting of: positional data from a location sensor of the telematic monitoring device which indicates a change in position or a movement speed of the vehicle; acceleration data from an accelerometer or inertial measurement unit (IMU) of the telematic monitoring device which indicates acceleration of the vehicle; audio data from an audio sensor of the telematic monitoring device which includes a representation of movement noise of the vehicle; image data from an image sensor of the telematic monitoring device which includes a representation of a changing environment of the vehicle; and status data generated by a processing unit of the telematic monitoring device which indicates whether the vehicle is in motion.

The battery device may be electrically coupled to at least one peripheral device; detecting, by the control circuitry, whether the vehicle is on may be based on data selected from the group consisting of: positional data from a location sensor of the at least one peripheral device which indicates a change in position or a movement speed of the vehicle; acceleration data from an accelerometer or inertial measurement unit (IMU) of the at least one peripheral device which indicates acceleration of the vehicle; audio data from an audio sensor of the at least one peripheral device which includes a representation of movement noise of the vehicle; image data from an image sensor of the at least one peripheral device which includes a representation of a changing environment of the vehicle; and status data generated by a processing unit of the at least one peripheral device which indicates whether the vehicle is in motion.

The method may further comprise outputting a signal indicative of disconnection in response to the telematic monitoring device being disconnected from the vehicle. Outputting the signal indicative of disconnection may comprise outputting an audible sound by an audio output device. Outputting the signal indicative of disconnection may comprise outputting an electronic signal over a communication network by a communication interface.

The method may further comprise: detecting, by the control circuitry, when power to the battery device is disconnected; detecting, by the control circuitry, whether the battery device is electrically coupled to the telematic monitoring device; and instructing, by the control circuitry, the telematic monitoring device to transmit a signal indicative of disconnection of power when power to the battery device is disconnected and the battery device is electrically coupled to the telematic monitoring device.

Receiving power from the vehicle by the battery device may comprise receiving power from the vehicle via the telematic monitoring device.

Provisioning power within the battery device may be performed by power circuitry of the battery device. Provisioning power received by the battery device and power provided by the battery device may be performed by the power circuitry.

Selecting, by the control circuitry, a select mode of operation may be based on at least data selected from the group consisting of: vehicle data provided to the battery device through the telematic monitoring device; sensor data from at least one sensor of the telematic monitoring device; instruction data from the telematic monitoring device; and sensor data from sensors of the battery device.

According to another broad aspect, the present disclosure describes a system comprising: a telematic monitoring device capable of obtaining data and power from a vehicle, the telematic monitoring device operable in a first plurality of modes including at least: a sleep mode where activity of the telematic monitoring device is limited; and an awake mode where the telematic monitoring device is operable to transmit a wireless signal; and a battery device electrically coupled to the telematic monitoring device, the battery device including control circuitry, at least one battery, and at least one temperature sensor, the control circuitry operable in a second plurality of modes including at least: a low-power mode where the control circuitry is inactive; and a measurement mode where the control circuitry is operable to analyze temperature data from the temperature sensor, wherein: during operation of the control circuitry in the low-power mode, the control circuitry of the battery device is operable to transition to operate in the measurement mode after a set period; during operation of the control circuitry in the measurement mode, the control circuitry is operable to compare a first temperature of the battery indicated in the temperature data to a first threshold, and to send a first alert to the telematic monitoring device if the first temperature of the battery exceeds the first threshold; during operation of the telematic monitoring device in the sleep mode, the telematic monitoring device is operable to transmit a second alert to a remote device in response to receiving the first alert from the battery device.

The control circuitry may be operable to, during operation of the control circuitry in the measurement mode, transition to the low-power mode if the first temperature of the battery is less than the first threshold.

The set period may be initially a first duration, and the control circuitry may be operable to, during operation of the control circuitry in the measurement mode: compare the first temperature of the battery indicated in the temperature data to a second threshold lower than the first threshold; and if the first temperature of the battery is higher than the second threshold and below the first threshold, set the set period to a second duration shorter than the first duration and transition to operate in the low-power mode. The control circuitry may be operable to, after setting the set period to the second duration and transitioning the control circuitry to operate in the low-power mode: during operation of the control circuitry in the low-power mode, transition the control circuitry to operate in the measurement mode after the set period; during operation of the control circuitry in the measurement mode, compare a second temperature of the battery indicated in the temperature data from the temperature sensor to the first threshold; and send the first alert to the telematic monitoring device if the second temperature of the battery exceeds the first threshold. The control circuitry may be operable to, after setting the set period to the second duration and transitioning the control circuitry to operate in the low-power mode: during operation of the control circuitry in the low-power mode, transition the control circuitry to operate in the measurement mode after the set period; during operation of the control circuitry in the measurement mode, compare a second temperature of the battery indicated in the temperature data from the temperature sensor to the second threshold; if the second temperature of the battery is below the second threshold, reset the set period to the first duration. The control circuitry may be operable to, after setting the set period to the second duration and transitioning the control circuitry to operate in the low-power mode: during operation of the control circuitry in the low-power mode, transition the control circuitry to operate in the measurement mode after the set period; during operation of the control circuitry in the measurement mode, compare a second temperature of the battery indicated in the temperature data from the temperature sensor to the second threshold; if the second temperature of the battery is below the second threshold, transition the control circuitry to operate in the low-power mode; and if temperature of the battery has not exceeded the second threshold for a set number of comparisons to the second threshold, reset the set period to the first duration. The control circuitry may be operable to, after setting the set period to the second duration and transitioning the control circuitry to operate in the low-power mode: during operation of the control circuitry in the low-power mode, transition the control circuitry to operate in the measurement mode after the set period; during operation of the control circuitry in the measurement mode, compare a second temperature of the battery indicated in the temperature data from the temperature sensor to the second threshold; if the second temperature of the battery is below the second threshold, transition the control circuitry to operate in the low-power mode; and if temperature of the battery has not exceeded the second threshold for an additional period longer than the set period, reset the set period to the first duration.

According to another broad aspect, the present disclosure describes a method of operating a telematic monitoring device and a battery device electrically coupled to the telematic monitoring device, the telematic monitoring device operable in a sleep mode where activity of the telematic monitoring device is limited and an awake mode where the telematic monitoring device is operable to transmit a wireless signal, the battery device including control circuitry, at least one battery, and at least one temperature sensor, the battery device operable in a low-power mode where the control circuitry is inactive and a measurement mode where the control circuitry is operable to analyze temperature data from the temperature sensor, the method comprising: during operation of the control circuitry in the low-power mode, transitioning the control circuitry to operate in the measurement mode after a set period; during operation of the control circuitry in the measurement mode, comparing a first temperature of the battery indicated in the temperature data from the temperature sensor to a first threshold, and sending a first alert to the telematic monitoring device if the first temperature of the battery exceeds the first threshold; during operation of the telematic monitoring device in the sleep mode, in response to the receiving the first alert from the battery device, transitioning the telematic monitoring device to operate in the awake mode to transmit a second alert to a remote device.

The method may further comprise: during operation of the control circuitry in the measurement mode, transitioning the control circuitry to the low-power mode if the first temperature of the battery is less than the first threshold.

The set period may be initially a first duration, and the method may further comprise, during operation of the control circuitry in the measurement mode: comparing the first temperature of the battery indicated in the temperature data from the temperature sensor to a second threshold lower than the first threshold; if the first temperature of the battery is higher than the second threshold and below the first threshold, setting the set period to a second duration shorter than the first duration; and transitioning the control circuitry to operate in the low-power mode. The method may further comprise, after setting the set period to the second duration and transitioning the control circuitry to operate in the low-power mode: during operation of the control circuitry in the low-power mode, transitioning the control circuitry to operate in the measurement mode after the set period; during operation of the control circuitry in the measurement mode, comparing a second temperature of the battery indicated in the temperature data from the temperature sensor to the first threshold; and sending the first alert to the telematic monitoring device if the second temperature of the battery exceeds the first threshold. The method may further comprise, after setting the set period to the second duration and transitioning the control circuitry to operate in the low-power mode: during operation of the control circuitry in the low-power mode, transitioning the control circuitry to operate in the measurement mode after the set period; during operation of the control circuitry in the measurement mode, comparing a second temperature of the battery indicated in the temperature data from the temperature sensor to the second threshold; if the second temperature of the battery is below the second threshold, resetting the set period to the first duration; and transitioning the control circuitry to operate in the low-power mode. The method may further comprise, after setting the set period to the second duration and transitioning the control circuitry to operate in the low-power mode: during operation of the control circuitry in the low-power mode, transitioning the control circuitry to operate in the measurement mode after the set period; during operation of the control circuitry in the measurement mode, comparing a second temperature of the battery indicated in the temperature data from the temperature sensor to the second threshold; if the second temperature of the battery is below the second threshold, transitioning the control circuitry to operate in the low-power mode; and if temperature of the battery has not exceeded the second threshold for a set number of comparisons to the second threshold, resetting the set period to the first duration. The method may further comprise, after setting the set period to the second duration and transitioning the control circuitry to operate in the low-power mode: during operation of the control circuitry in the low-power mode, transitioning the control circuitry to operate in the measurement mode after the set period; during operation of the control circuitry in the measurement mode, comparing a second temperature of the battery indicated in the temperature data from the temperature sensor to the second threshold; if the second temperature of the battery is below the second threshold, transitioning the control circuitry to operate in the low-power mode; and if temperature of the battery has not exceed the second threshold for an additional period longer than the set period, resetting the set period to the first duration.

According to another broad aspect, the present disclosure describes a system comprising: a telematic monitoring device capable of obtaining data and power from a vehicle; a battery device electrically coupled to the telematic monitoring device, the battery device including at least one battery and the battery device capable to provide power to the telematic monitoring device if power from the vehicle is unavailable; and an emergency user interface capable of receiving user input indicative of an emergency situation, wherein in response to the emergency user interface receiving the user input indicative of an emergency situation, a wireless communication interface of the system is operable to send an emergency message to be received by a remote device.

The emergency user interface may be included in the telematic monitoring device; and the wireless communication interface may be included in the telematic monitoring device.

The emergency user interface may be included in the battery device. The wireless communication interface may be included in the battery device. The wireless communication interface may be included in the telematic monitoring device; and the battery device may be operable to, in response to the emergency user interface receiving the user input indicative of an emergency situation, send the emergency message to the telematic monitoring device, for sending by the wireless communication interface of the telematic monitoring device.

The emergency user interface may be included in a peripheral device of the system. The peripheral device may be electrically coupled to the battery device. The peripheral device may be electrically coupled to the telematic monitoring device. The wireless communication interface may be included in the peripheral device. The peripheral device may be electrically coupled to the battery device; the wireless communication interface may be included in the battery device; and in response to the emergency user interface receiving the user input indicative of an emergency situation, the peripheral device may be operable to send the emergency message to the battery device, for sending by the wireless communication interface of the battery device. The peripheral device may be electrically coupled to the telematic monitoring device; the wireless communication interface may be included in the telematic monitoring device; and the peripheral device may be operable to, in response to the emergency user interface receiving the user input indicative of an emergency situation, send the emergency message to the telematic monitoring device, for sending by the wireless communication interface of the telematic monitoring device. The peripheral device may be electrically coupled to the battery device; the wireless communication interface may be included in the telematic monitoring device; and in response to the emergency user interface receiving the user input indicative of an emergency situation, the peripheral device may be operable to send the emergency message to the telematic monitoring device via the battery device, for sending by the wireless communication interface of the telematic monitoring device.

According to another broad aspect, the present disclosure describes a method of operating a telematic monitoring system including a telematic monitoring device capable of obtaining data and power from a vehicle, a battery device electrically coupled to the telematic monitoring device, the battery device including at least one battery and the battery device capable to provide power to the telematic monitoring device if power from the vehicle is unavailable, and an emergency user interface, the method comprising: receiving, by the emergency user interface, user input indicative of an emergency situation; in response to the emergency user interface receiving the user input indicative of the emergency situation, sending, by a wireless communication interface of the telematic monitoring system, an emergency message to be received by a remote device.

The emergency user interface may be included in the telematic monitoring device; the wireless communication interface may be included in the telematic monitoring device; and sending the emergency message may comprise sending the emergency message by the wireless communication interface of the telematic monitoring device to be received by the remote device.

The emergency user interface may be included in the battery device. The wireless communication interface may be included in the battery device. The wireless communication interface may be included in the telematic monitoring device; and sending the emergency message to be received by the remote device may comprise sending, by the battery device, the emergency message to the telematic monitoring device and sending, by the wireless communication interface of the telematic monitoring device, the emergency message to be received by the remote device.

The emergency user interface may be included in a peripheral device of the system. The peripheral device may be electrically coupled to the battery device. The peripheral device may be electrically coupled to the telematic monitoring device. The wireless communication interface may be included in the peripheral device. The peripheral device may be electrically coupled to the battery device; the wireless communication interface may be included in the battery device; and sending the emergency message to be received by the remote device may comprise sending, by the peripheral device, the emergency message to the battery device and sending, by the wireless communication interface of the battery device, the emergency message to be received by the remote device. The peripheral device may be electrically coupled to the telematic monitoring device; the wireless communication interface may be included in the telematic monitoring device; and sending the emergency message to be received by the remote device may comprise sending, by the peripheral device, the emergency message to the telematic monitoring device and sending, by the wireless communication interface of the telematic monitoring device, the emergency message to be received by the remote device. The peripheral device may be electrically coupled to the battery device; the wireless communication interface may be included in the telematic monitoring device; and sending the emergency message to be received by the remote device may comprise sending, by the peripheral device, the emergency message to the telematic monitoring device via the battery device, and sending, by the wireless communication interface of the telematic monitoring device, the emergency message to be received by the remote device.

BRIEF DESCRIPTION OF THE DRAWINGS

Exemplary non-limiting embodiments are described with reference to the accompanying drawings in which.

DETAILED DESCRIPTION

Figure 1:
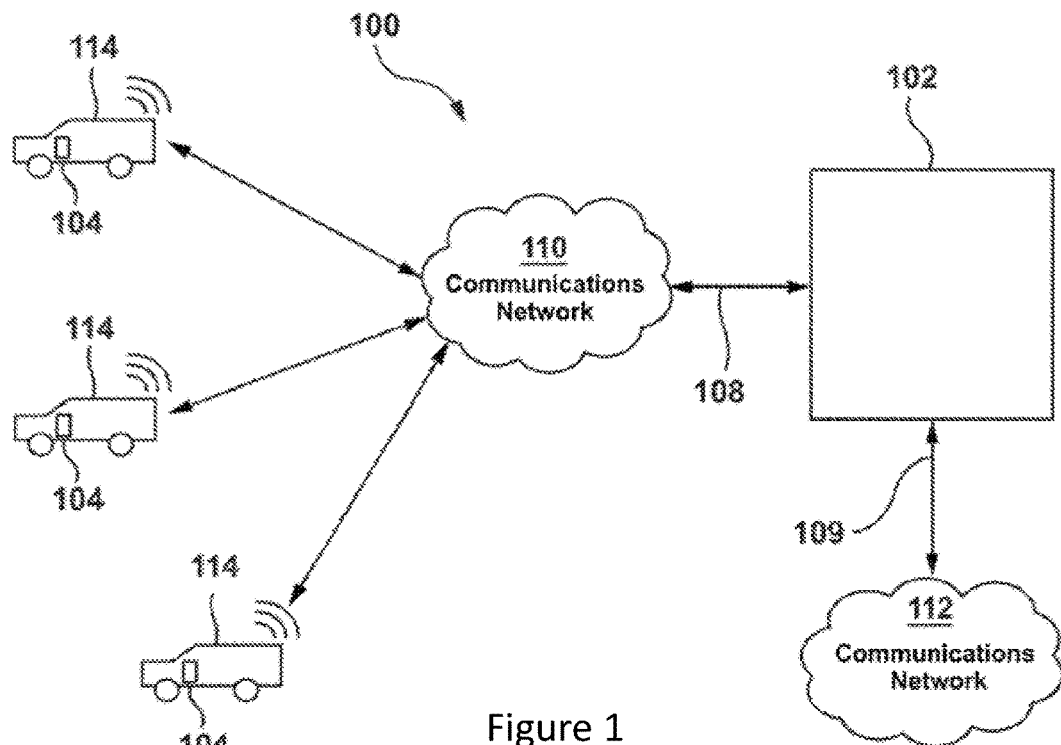
FIG. 1 is a block diagram of an exemplary telematics system for gathering and storing vehicle information.

Telematics systems have been employed by fleet owners to monitor use and performance of vehicles in the fleet. A telematics system monitors a vehicle using an onboard telematic monitoring device for gathering and transmitting vehicle operation information. For instance, fleet managers can employ telematics to have remote access to real time operation information of each vehicle in a fleet. A vehicle may include a car, truck, recreational vehicle, heavy equipment, tractor, snowmobile or other transportation asset. A telematic monitoring device may detect environmental operating conditions associated with a vehicle, for example, outside temperature, attachment status of an attached trailer, and temperature inside an attached refrigeration trailer. A telematic monitoring device may also detect operating conditions of an associated vehicle, such as position, (e.g., geographic coordinates), speed, and acceleration, time of day of operation, distance traveled, stop duration, customer location, idling duration, driving duration, among others. Hence, the telematic monitoring device collects and transmits data to the telematics system that is representative of the vehicle operation and usage execution during times the vehicle is in use. This data may be collected over a time period of sufficient duration to allow for pattern recognition of the vehicle's operation. In an example the duration may be determined to be a number of days between 30 days and 90 days, though in practice any appropriate number of days could be implemented as the duration.

In an exemplary telematics system, raw vehicle data, including vehicle operation information indicative of a vehicle's operating conditions, is transmitted from an onboard telematic monitoring device to a remote subsystem, (e.g., data management system which may comprise a cloud system or a management system). Raw vehicle data may include information indicating the identity of the onboard telematic monitoring device (e.g., device identifier, device ID) and/or the identity of the associated vehicle the onboard telematic monitoring device is aboard. Specific and non-limiting examples of raw vehicle data includes device ID data, position data, speed data, ignition state data, (e.g. indicates whether vehicle ignition is ON or OFF), and datetime data indicative of a date and time vehicle operating conditions were logged by the telematic monitoring device. Raw vehicle data transmitted and collected over a period of time forms historical vehicle data which may be stored by the remote subsystem for future analysis of a single vehicle or fleet performance. In practice, a single fleet may comprise many vehicles, and thus large volumes of raw vehicle data (e.g., terabytes, petabytes, exabytes . . . ) may be transmitted to, and stored by, a remote subsystem.

In other exemplary telematics systems, a telematic monitoring device can have at least one processing unit thereon which processes or filters raw vehicle data, and transmits processed or filtered data. Such systems can reduce the bandwidth required for transmission and required storage capacity for transmitted data.

While the use of telematics systems has resulted in improved performance and maintenance of vehicles in the fleet, onboard telematic monitoring devices are dependent on power from vehicles. This can result in situational loss of power to the telematic monitoring device, which in turn causes interruptions or inaccuracies in telematic data. For example, power to the telematic monitoring device is lost when the telematic monitoring device is unplugged from the vehicle, which results in interruption of collection, processing, and communication of telematics data. As another example, collection, processing, and communication of telematics data can be hindered or interrupted when a connection between a telematic monitoring device and a vehicle is unstable or poor. Connection issues can arise for example due to a bad/lose installation or the telematic monitoring device becoming dislodged due to impact or a vehicle collision, as non-limiting examples. Lack of power to the telematic monitoring device (and lack of communication therewith) can also occur for other reasons. As one example, a vehicle battery could die. As another example, a vehicle thief could disconnect a vehicle battery prior to stealing the vehicle by towing or hauling the vehicle, such that the telematic monitoring device cannot be easily used to track the vehicle.

The present disclosure describes battery backup devices, systems which include such battery devices, and methods of operation of such battery devices and systems, such that power is provided to a telematic monitoring device even in the event of lack of power from a vehicle. By providing backup power to the telematic monitoring device, telematic monitoring can continue even in the event of lack of power from the vehicle.

Illustrated in FIG. 1 is a simplified block diagram of an exemplary telematics system for gathering and storing vehicle operation information. Telematics system 100 comprises telematics subsystem 102 having a first network interface 108 and onboard telematic monitoring devices 104 of vehicles 114 communicatively coupled therewith via communication network 110.

The telematics subsystem 102 in an implementation comprises a management system which is a managed cloud data warehouse for performing analytics on data stored therein. In another implementation, the management system may comprise a plurality of management systems, datastores, and other devices, configured in a centralized, distributed or other arrangement. In some implementations, one or more different management systems may be employed and configured separately or in a centralized, distributed or other arrangement.

Communication network 110 may include one or more computing systems and may be any suitable combination of networks or portions thereof to facilitate communication between network components. Some examples of networks include, Wide Area Networks (WANs), Local Area Networks (LANs), Wireless Wide Area Networks (WWANs), data networks, cellular networks, voice networks, among other networks, which may be wired and/or wireless. Communication network 110 may operate according to one or more communication protocols, such as, General Packet Radio Service (GPRS), Universal Mobile Telecommunications Service (UMTS), GSM, Enhanced Data Rates for GSM Evolution (EDGE), LTE, CDMA, LPWAN, Wi-Fi, Bluetooth®, Ethernet, HTTP/S, TCP, and CoAP/DTLS, or other suitable protocol. Communication network 110 may take other forms as well.

Telematics system 100 may comprise another network interface 109 for communicatively coupling to another communication network 112. In an implementation, communication network 112 may comprise a communication gateway between the fleet owners and the telematics system 100.

Also shown in FIG. 1 are vehicles 114, each thereof having aboard the onboard telematic monitoring devices 104. A vehicle may include a car, truck, recreational vehicle, heavy equipment, tractor, snowmobile, or other transportation asset. Onboard telematic monitoring devices 104 may transmit raw vehicle data associated with vehicles 114 through the communication network 110 to the telematics subsystem 102.

Three telematic monitoring devices 104 are described in this example for explanation purposes only and embodiments are not intended to be limited to the examples described herein. In practice, a telematics system may comprise many vehicles 114, such as hundreds, thousands and tens of thousands or more. Thus, huge volumes of raw vehicle data may be received and stored by remote telematics subsystem 102.

In general, telematic monitoring devices 104 comprise sensing modules configured for sensing and/or measuring a physical property that may indicate an operating condition of a vehicle. For example, sensing modules may sense and/or measure a vehicle's position, (e.g., GPS coordinates), speed, direction, rates of acceleration or deceleration, for instance, along the x-axis, y-axis, and/or z-axis, altitude, orientation, movement in the x, y, and/or z direction, ignition state, transmission and engine performance, and times of operation among others. One of ordinary skill in the art will appreciate that these are but a few types of vehicle operating conditions that may be detected.

Telematic monitoring device 104 may comprise a sensing module for determining vehicle position. For instance, the sensing module may utilize Global Positioning System (GPS) technology (e.g., GPS receiver) for determining the geographic position (Lat/Long coordinates) of vehicle 114. Alternatively, the sensing module can utilize another global navigation satellite system (GNSS) technology, such as, GLONASS or BeiDou. Alternatively, the sensing module may further utilize another kind of technology for determining geographic position. In addition, the sensing module may provide other vehicle operating information, such as speed. Alternatively, the telematic monitoring device 104 may communicate with a plurality of sensing modules for a vehicle.

Alternatively, vehicle position information may be provided according to another geographic coordinate system, such as, Universal Transverse Mercator, Military Grid Reference System, or United States National Grid.

In general, a vehicle 114 may include various control, monitoring and/or sensor modules for detecting vehicle operating conditions. Some specific and non-limiting examples include, an engine control unit (ECU), a suspension and stability control module, a headlamp control module, a windscreen wiper control module, an anti-lock braking system module, a transmission control module, and a braking module. A vehicle may have any combination of control, monitoring and/or sensor modules. A vehicle may include a data/communication bus accessible for monitoring vehicle operating information, provided by one or more vehicle control, monitoring and/or sensor modules. A vehicle data/communication bus may operate according to an established data bus protocol, such as the Controller Area Network bus (CAN-bus) protocol that is widely used in the automotive industry for implementing a distributed communications network. Specific and non-limiting examples of vehicle operation information provided by vehicle monitoring and/or sensor modules include, ignition state, fuel tank level, intake air temp, and engine RPM among others.

Telematic monitoring device 104 may comprise a monitoring module operable to communicate with a data/communication bus of vehicle 114. The monitoring module may communicate via a direct connection, such as, electrically coupling, with a data/communication bus of vehicle 114 via a vehicle communication port, (e.g., diagnostic port/communication bus, OBDII port). Alternatively, the monitoring module may comprise a wireless communication interface for communicating with a wireless interface of the data/communication bus of vehicle 114. Optionally, a monitoring module may communicate with other external devices/systems that detect operating conditions of the vehicle.

Telematic monitoring device 104 may be operable to wirelessly communicate with telematics subsystem 102 via a wireless communication module. In some embodiments, telematic monitoring device 104 may directly communicate with one or more networks outside vehicle 114 to transmit data to telematics subsystem 102. A person of ordinary skill will recognize that functionality of some modules may be implemented in one or more devices and/or that functionality of some modules may be integrated into the same device.

Telematic monitoring devices 104 may transmit raw vehicle data, indicative of vehicle operation information collected thereby, to telematics subsystem 102. The raw vehicle data may be transmitted at predetermined time intervals, (e.g. heartbeat), intermittently, and/or according to other predefined conditions. Raw vehicle data transmitted from telematic monitoring devices 104 may include information indicative of device ID, position, speed, ignition state, and date and time operating conditions are logged, for instance, in an onboard datastore. One of ordinary skill in the art will appreciate that raw vehicle data may comprise data indicative of numerous other vehicle operating conditions. Raw vehicle data may be transmitted from a monitoring device when a vehicle is moving, stationary, and during both ON and OFF ignition states.

Figure 2:
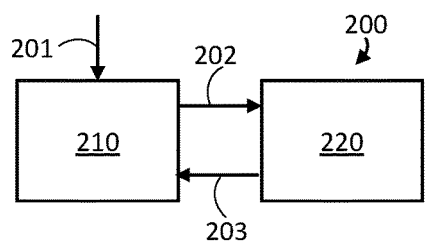
FIGS. 2, 3, 4, 5, 6, and 7 are schematic diagrams of respective onboard telematic monitoring systems, in accordance with at least six illustrated implementations.

FIG. 2 is a schematic diagram of an onboard telematic monitoring system 200. Telematic monitoring system 200 includes a telematic monitoring device 210 and a battery device 220, coupled by electrical pathways. "Electrical pathways" (sometimes shortened to "pathways") as used throughout this disclosure refers to electrically conductive components which provide electrical coupling, such as wires, conductive traces, contacts, vias, or any other appropriate electrically conductive component. An electrical pathway can be a single electrically conductive component (e.g. a single wire), but this is not necessarily the case. For example, an electrical pathway could include a plurality of wires, conductive traces, contacts, or vias. Likewise, in some of the illustrated implementations, separate electrical pathways are illustrated, but in some cases certain electrical pathways could be combined as a single pathway or group of pathways.

In the example illustrated in FIG. 2, telematic monitoring device 210 receives power and vehicle data from a vehicle by electrical pathway 201. Electrical pathway 201 could include for example a diagnostic port such as an OBDII port, a peripheral port such as a 12V or 24V power port (e.g. cigarette lighter port), or multiple ports in combination. Battery device 220 can receive power from the vehicle via telematic monitoring device 210, over electrical pathway 202. Battery 220 can provide power to the telematic monitoring device over electrical pathway 203. In this way, depending on that state of the vehicle and the connection with the telematic monitoring device 210, the battery device 220 can charge with power from the vehicle, or the battery device 220 can power telematic monitoring device 210 when power from the vehicle is disconnected, inconsistent, or insufficient (modes of operation of battery device 220 are discussed later with reference to FIGS. 13, 14, 15, and 16). Although electrical pathways 202 and 203 are illustrated separately, in some implementations power can be provided from telematic monitoring device 210 to battery device 220, and from battery device 220 to telematic monitoring device 210 by the same electrical pathway. Additionally, electrical pathway 202 or 203 could also be used to communicate data (such as control data, or data to or from peripheral devices as discussed later with reference to FIGS. 3, 4, 5, 6, and 7) between battery device 220 and telematic monitoring device 210.

While a broader "telematics system" can include communication between subsystem components as described above with reference to FIG. 1, the terminology "onboard telematic monitoring system" is intended to refer to a collection of components of a telematic system which are provided in or on a vehicle (i.e. onboard the vehicle).

Figure 3:
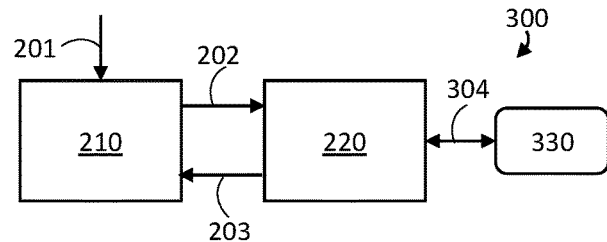

FIG. 3 is a schematic diagram of an onboard telematic monitoring system 300. Telematic monitoring system 300 is similar to telematic monitoring system 200, and description of telematic monitoring system 200 applies to telematic monitoring system 300 unless context dictates otherwise. Telematic monitoring system 300 includes telematic monitoring device 210 and battery device 220, coupled by electrical pathways 202 and 203 similar to telematic monitoring system 200. Telematic monitoring system 300 also includes a peripheral device 330 electrically coupled to battery device 220 by electrical pathway 304. Battery device 220 can provide power to peripheral device 330 over electrical pathway 304. This power could be from at least one battery in battery device 220, or could be power which passes through battery device 220 from telematic monitoring device 210. Battery device 220 can be configured with control circuitry to enable or disable provision of power to peripheral device 330, as appropriate to conserve power. This is discussed in detail later with reference to FIGS. 13, 14, 15, and 16.

Peripheral devices are discussed throughout this disclosure, and can include a wide variety of devices. Non-limiting examples of peripheral devices can include for example cameras, microphones, logging devices (such as work-hour logging devices), key storage devices, or vehicle unlocking devices. However, any peripheral device could be used as appropriate for a given application.

Although electrical pathway 304 is illustrated as a single two directional pathway, electrical pathway 304 could be implemented as a plurality of pathways, and each pathway can be one-directional or two-directional. Further, in addition to power, electrical pathway 304 (or select electrical pathways therein) can be used to communicate data, control information, signals, or any other appropriate information, between peripheral device 330 and battery device 220. For example, sensor data from sensors of peripheral device 330 could be communicated to battery device 220 over electrical pathway 304, and this sensor data in turn could be communicated to telematics monitoring device 210, for processing and/or communication over a network. As another example, battery device 220 could send instructions over electrical pathway 304 for peripheral device 330 to control a mode of peripheral device 330 (e.g. cause peripheral device 330 to enter a low power mode or turn off when battery device 220 is not receiving power from a vehicle, or cause peripheral device 330 to enter a full-power mode when battery device 220 is receiving power from a vehicle).

Figure 4:
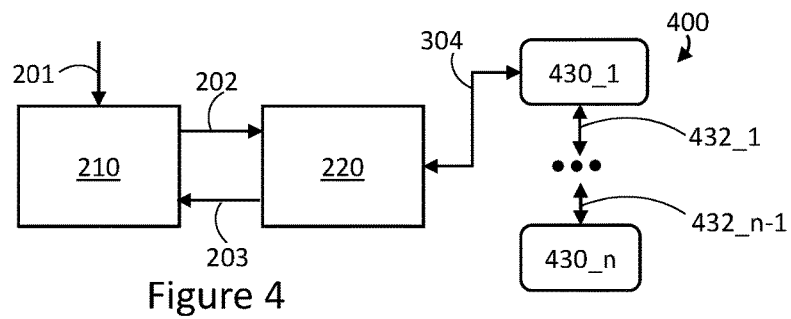

FIG. 4 is a schematic diagram of an onboard telematic monitoring system 400. Telematic monitoring system 400 is similar to telematic monitoring systems 200 and 300, and description of telematic monitoring systems 200 and 300 applies to telematic monitoring system 400 unless context dictates otherwise. Telematic monitoring system 400 includes telematic monitoring device 210 and battery device 220, coupled by electrical pathways 202 and 203 similar to telematic monitoring system 200. Telematic monitoring system 400 also includes a plurality of peripheral devices collectively numbered as 430. The illustrated plurality of peripheral devices includes peripheral device 430_1, up to peripheral device 430_$n$, where n is the number of peripheral devices. Any appropriate number of peripheral devices could be implemented such as two, three, four, five, or even more peripheral devices. In the illustrated implementation, peripheral device 430_1 is electrically coupled to battery device 220 by electrical pathway 304, similarly to peripheral device 330 in FIG. 3. The remaining peripheral devices are daisy-chained (connected in sequence) to peripheral device 430_1.

Electrical pathways coupling a sequence of peripheral devices are collectively numbered as 432. In the illustrated example, peripheral device 430_1 is electrically coupled to a subsequent peripheral device by electrical pathway 432_1, and peripheral device 430_$n$ is electrically coupled to a preceding peripheral device by electrical pathway 432_$n$-1. An appropriate number of electrical pathways can be included as needed to couple a sequence of any appropriate number of peripheral devices. In the case where there are exactly two peripheral devices (n=2), then electrical pathways 432_1 and 432_$n$-1 are the same electrical pathway. Similarly to as discussed above regarding electrical pathway 304, although electrical pathways 432 are each illustrated (specifically illustrated electrical pathways 432_1 and 432_$n$) as a single two directional pathway, each electrical pathway could be implemented as a plurality of pathways, and each pathway can be one-directional or two-directional. Further, in addition to power, electrical pathways 432 (or select electrical pathways therein) can be used to communicate data, control information, signals, or any other appropriate information, between peripheral devices 430 and battery device 220. For example, sensor data from sensors of any of the plurality of peripheral devices 430 could be communicated to battery device 220 over electrical pathways 304 and 432, and this sensor data in turn could be communicated to telematic monitoring device 210, for processing and/or communication over a network. As another example, battery device 220 could send instructions over electrical pathways 304 and 432 to peripheral devices 430 to control modes of peripheral devices 430 (such as low-power, off, or full power modes similar to as mentioned above).

Figure 5:
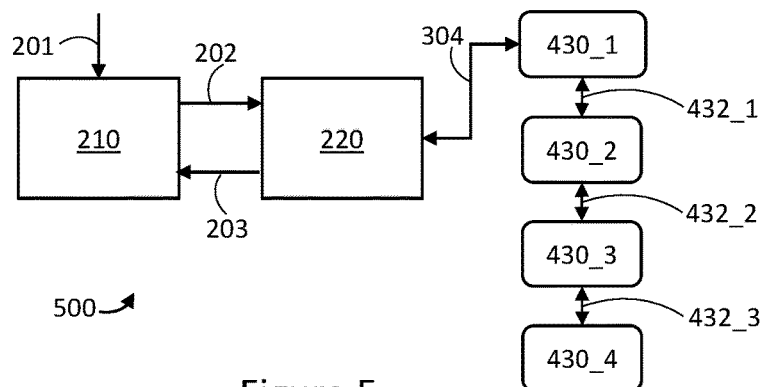

FIG. 5 is a schematic diagram of an onboard telematic monitoring system 500. Telematic monitoring system 500 is similar to telematic monitoring system 400, and description of telematic monitoring system 400 applies to telematic monitoring system 500 unless context dictates otherwise.

Telematic monitoring system 500 in FIG. 5 is an exemplary implementation of telematic monitoring system 400, where four peripheral devices are included and electrically coupled to battery device 220 (n=4). Peripheral device 430_1 is electrically coupled to battery device 220 by electrical pathway 304. Peripheral device 430_2 is electrically coupled to peripheral device 430_1 by electrical pathway 432_1. Peripheral device 430_3 is electrically coupled to peripheral device 430_2 by electrical pathway 432_2. Peripheral device 430_4 is electrically coupled to peripheral device 430_3 by electrical pathway 432_3. Power and data can be transmitted to each of the peripheral devices through the chain of peripheral devices. For example, peripheral device 430_4 receives power from battery device 220 through peripheral devices 430_1, 430_2, and 430_3, and through electrical pathways 432_1, 432_2, and 432_3 (whether the power originates from a battery on battery device 220, or from a vehicle where battery device 220 receives power from). Data, control information, signals, or other appropriate information can be provided to the peripheral devices by battery device 220, or received from the peripheral devices by battery device 220, in a similar manner.

Figure 6:
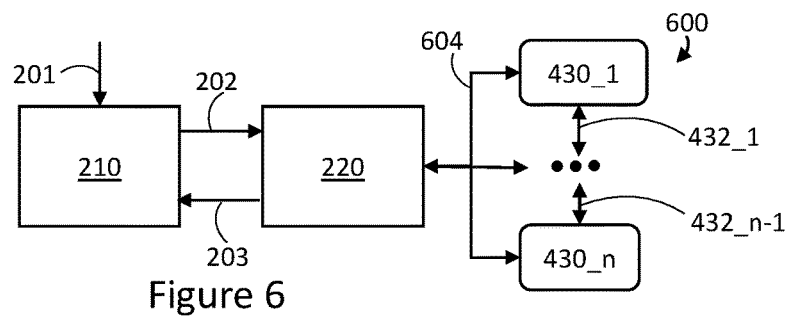

FIG. 6 is a schematic diagram of an onboard telematic monitoring system 600. Telematic monitoring system 600 is similar to telematic monitoring system 400, and description of telematic monitoring system 400 applies to telematic monitoring system 600 unless context dictates otherwise. One difference between telematic monitoring system 600 and telematic monitoring system 400 is that telematic monitoring system 600 includes a set of electrical pathways 604 by which battery device 220 is directly electrically coupled to each peripheral device in a plurality of peripheral devices 430. In this way, power can be provided directly to each peripheral device from battery device 220. Data, control information, or signals can also be communicated between the peripheral devices 430 and battery device 220 directly, instead of transmission through a chain of devices.

Figure 7:
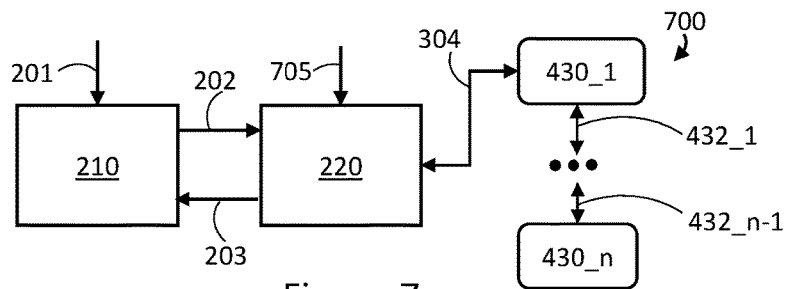

FIG. 7 is a schematic diagram of an onboard telematic monitoring system 700. Telematic monitoring system 700 is similar to telematic monitoring system 400, and description of telematic monitoring system 400 applies to telematic monitoring system 700 unless context dictates otherwise. One difference between telematic monitoring system 700 and telematic monitoring system 400 is that in telematic monitoring system 700, power is provided to battery device 220 by electrical pathway 705. For example, electrical pathway 705 can connect to a vehicle power source, such that power is supplied directly to battery device 220 from the vehicle, instead of power being supplied to battery device 220 from telematic monitoring device 210. Provision of power directly from the vehicle to battery device 220 could also be used in the implementations illustrated in FIGS. 2, 3, 4, 5 and 6, as appropriate for a given application.

Figure 8:
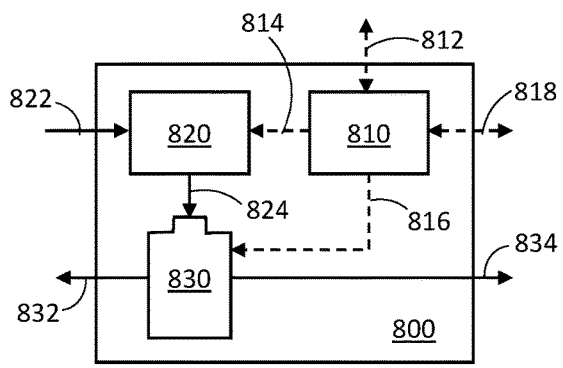
FIGS. 8, 9, and 10 are schematic diagrams of respective battery devices in accordance with at least three exemplary illustrated implementations.

FIG. 8 is a schematic diagram of a battery device 800. Battery device 800 could be used as battery device 220 in any of the implementations discussed with reference to FIGS. 2, 3, 4, 5, 6, and 7. Battery device 800 includes control circuitry 810, power circuitry 820, and at least one battery 830. FIG. 8 shows electrical pathways 812, 814, 816, 818, 822, 824, 832, and 834 between components. In the context of FIG. 8 (and FIGS. 9, 10, 13, 14, 15, 16, and 17 discussed later), electrical pathways illustrated as solid lines (in FIG. 8 pathways 822, 824, 832, and 834) indicate pathways by which power travels, whereas electrical pathways illustrated by dashed lines (in FIG. 8 pathways 812, 814, 816, and 818) indicate pathways by which data, information, or signals are sent.

Control circuitry 810 controls operation of battery device 800 and the components therein. In the example, control circuitry 810 receives data from a telematic monitoring device (such as telematic monitoring device 210 in FIGS. 2-7), sensors in the battery device, and/or peripheral devices electrically coupled to battery device 800 over electrical pathways 812 or 818, and can select a mode of operation for battery device 800 based on the received data. Control circuitry 810 can also provide data, information, or signals to the telematic monitoring device over electrical pathway 812. Additionally, control circuitry 810 can provide (or receive) data, information, or signals to (or from) any peripheral devices electrically coupled to battery device 800 (such as peripheral devices 330 and 430_1 to 430_n discussed with reference to FIGS. 3-7) over electrical pathway 818. Control circuitry 810 (or any other control circuitry discussed herein) could include any appropriate hardware which can process signals, such as any of a processor, integrated circuit, microcontroller unit (MCU), field-programmable gate array (FPGA), programmable logic device (PLD), logic circuitry, etcetera.

Power circuitry 820 provisions power to and within battery device 800, such as to at least one battery 830 for charging. Though not illustrated to avoid clutter, power circuitry 820 can also provision power to control circuitry 810 for operation thereof. In the illustrated example, power circuitry 820 receives power by electrical pathway 822, and can provide power to battery 830 by electrical pathway 824 to charge the at least one battery 830. Whether provision of power to the at least one battery 830 is enabled can be controlled by control circuitry 810, such as by at least one control signal sent by electrical pathway 814. Exemplary modes of operation of the battery devices described herein are discussed later with reference to FIGS. 13, 14, 15, and 16. Power circuitry 820 could include any appropriate hardware which can provision power, such as any of an integrated circuit, field-programmable gate array (FPGA), programmable logic device (PLD), logic circuitry, printed circuit board (PCB), etcetera.

The at least one battery 830 is an energy storage device. The at least one battery can include any appropriate number of battery cells, such as one cell, two cell, three cells, four cells, or even more cells if appropriate for a particular application. In the implementation illustrated in FIG. 8, battery 830 can output power directly via electrical pathway 832 to a telematic monitoring device (such as telematics monitoring device 210 in FIGS. 2-7), and can output power directly to a peripheral device by electrical pathway 834. Whether provision of power by battery 830 is enabled or disabled over each respective electrical pathway 832 and 834 can be controlled by control circuitry 810, such as by at least one control signal sent by electrical pathway 816. Alternatively, operation of the at least one battery 830 could be controlled indirectly, by at least one control signal sent to power circuitry 820 via electrical pathway 814, with power circuitry 820 controlling provision of power to the at least one battery 830.

Figure 9:
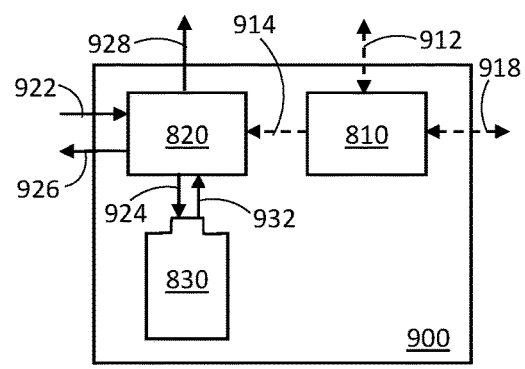

FIG. 9 is a schematic diagram of a battery device 900. Battery device 900 is similar to battery device 800 discussed with reference to FIG. 8, and discussion of battery device 800 is applicable to battery device 900 unless context dictates otherwise. Battery device 900 could be used as battery device 220 in any of the implementations discussed with reference to FIGS. 2, 3, 4, 5, 6, and 7. Battery device 900 includes control circuitry 810, power circuitry 820, and at least one battery 830 similar to battery device 800 in FIG. 8.

One difference between battery device 900 and battery device 800 is how the components of battery device 900 are interconnected and interact with each other. Similarly to FIG. 8, FIG. 9 shows electrical pathways 912, 914, 918, 922, 924, 926, 928, and 932 between components; in FIG. 9, pathways illustrated as solid lines (pathways 922, 924, 926, 928, and 932) indicate pathways by which power travels, whereas pathways illustrated by dashed lines (pathways 912, 914, and 918) indicate pathways by which data, information, or signals are sent.

In FIG. 9, control circuitry 810 controls operation of battery device 900 and the components therein. In the example, control circuitry 810 receives data from a telematic monitoring device (such as telematic monitoring device 210 in FIGS. 2-7), sensors in the battery device 900, and/or peripheral devices electrically coupled to battery device 900 over electrical pathways 912 or 918, and can select an operational mode of battery device 900 based on the received data. Control circuitry 810 can also provide data, information, or signals to the telematic monitoring device over electrical pathway 912. Additionally, control circuitry 810 can provide data, information, or signals to any peripheral devices electrically coupled to battery device 900 (such as peripheral devices 330 and 430_1 to 430_n discussed with reference to FIGS. 3-7) over electrical pathway 918. Control circuitry 810 could include any appropriate hardware which can process signals, such as any of a processor, microcontroller unit (MCU), integrated circuit, field-programmable gate array (FPGA), programmable logic device (PLD), logic circuitry, etcetera.

In FIG. 9, power circuitry 820 provisions power to and from battery device 900, and provisions power to the at least one battery 830 for charging. In the illustrated example, power circuitry 820 receives power by electrical pathway 922, and provides power to battery 830 by electrical pathway 924 to charge the at least one battery 830. Whether charging of battery 830 is enabled can be controlled by control circuitry 810, such as by at least one control signal sent by electrical pathway 914. Exemplary modes of operation of the battery devices described herein are discussed later with reference to FIGS. 13, 14, 15, and 16. Power circuitry 820 could include any appropriate hardware which can provision power, such as any of an integrated circuit, field-programmable gate array (FPGA), programmable logic device (PLD), logic circuitry, printed circuit board, etcetera.

Similar to as in FIG. 8, the at least one battery 830 is an energy storage device. The at least one battery 830 can include any appropriate number of battery cells, such as one cell, two cell, three cells, four cells, or even more cells if appropriate for a particular application. In the implementation illustrated in FIG. 9, battery 830 can output power to power circuitry 820 by electrical pathway 932. In turn, power circuitry 820 can output power to a telematic monitoring device (such as telematic monitoring device 210 in FIGS. 2-7) by electrical pathway 926, and can output power to a peripheral device by electrical pathway 928. Whether provision of power from the at least one battery 830 by power circuitry 820 is enabled or disabled over each respective electrical pathway 926 and 928 can be controlled by control circuitry 810, such as by at least one control signal sent by electrical pathway 914.

Figure 10:
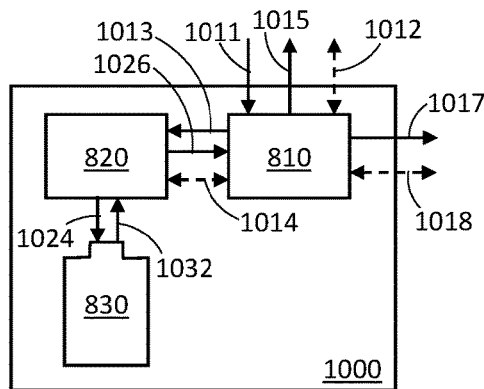

FIG. 10 is a schematic diagram of a battery device 1000. Battery device 1000 is similar to battery device 800 discussed with reference to FIG. 8 and battery device 900 discussed with reference to FIG. 9, and discussion of battery devices 800 and 900 is applicable to battery device 1000 unless context dictates otherwise. Battery device 1000 could be used as battery device 220 in any of the implementations discussed with reference to FIGS. 2, 3, 4, 5, 6, and 7. Battery device 1000 includes control circuitry 810, power circuitry 820, and at least one battery 830 similarly to battery devices 800 and 900 in FIGS. 8 and 9.

One difference between battery device 1000 and battery devices 800 and 900 is how the components of battery device 1000 are interconnected and interact with each other. Similarly to FIGS. 8 and 9, FIG. 10 shows electrical pathways 1011, 1012, 1013, 1014, 1015, 1017, 1018, 1024, 1026, and 1032 between components; in FIG. 10, pathways illustrated as solid lines (pathways 1011, 1013, 1015, 1017, 1024, 1026, and 1032) indicate pathways by which power travels, whereas pathways illustrated by dashed lines (pathways 1012, 1014, and 1018) indicate pathways by which data, information, or signals are sent.

In FIG. 10, control circuitry 810 controls operation of battery device 1000 and the components therein. In the example, control circuitry 810 receives data from a telematic monitoring device (such as telematic monitoring device 210 in FIGS. 2-7), sensors in the battery device 1000, and/or peripheral devices electrically coupled to battery device 1000 over electrical pathways 1012 or 1018, and can select an operational mode for the battery device 1000 based on the received data. Control circuitry 810 can also provide data, information, or signals to the telematic monitoring device over electrical pathway 1012. Additionally, control circuitry 810 can provide data, information, or signals to any peripheral devices electrically coupled to battery device 1000 (such as peripheral devices 330 and 430_1 to 430_n discussed with reference to FIGS. 3-7) over electrical pathway 1018. In the example of FIG. 10, control circuitry 810 also receives and provisions power to and from battery device 1000. Control circuitry 810 receives power over electrical pathway 1011 (such as from a vehicle, directly or through the telematic monitoring device). Control circuitry 810 provides power to power circuitry 820 over electrical pathway 1013, and provides power to any peripheral devices over electrical pathway 1017. Control circuitry 810 could include any appropriate hardware which can process signals, such as any of a processor, microcontroller unit (MCU), integrated circuit, field-programmable gate array (FPGA), programmable logic device (PLD), logic circuitry, etcetera.

Power circuitry 820 in battery device 1000 provisions power to the at least one battery 830 for charging. In the example illustrated in FIG. 10, power circuitry 820 receives power from control circuitry 810 by electrical pathway 1013, and provides power to battery 830 by electrical pathway 1024 to charge battery 930. Whether charging of battery 830 is enabled can be controlled by control circuitry 810, such as by at least one control signal sent to power circuitry 820 by electrical pathway 1014. Exemplary modes of operation of the battery devices described herein are discussed later with reference to FIGS. 13, 14, 15, and 16. Power circuitry 820 could include any appropriate hardware which can provision power, such as any of an integrated circuit, field-programmable gate array (FPGA), programmable logic device (PLD), logic circuitry, printed circuit board (PCB), etcetera.

Similar to in FIGS. 8 and 9, the at least one battery 830 is an energy storage device. The at least one battery can include any appropriate number of battery cells, such as one cell, two cells, three cells, four cells, or even more cells if appropriate for a particular application. In the implementation illustrated in FIG. 10, battery 830 can output power to power circuitry 820 by electrical pathway 1032. In turn, power circuitry 820 can output power to control circuitry 810 by electrical pathway 1026. In turn, control circuitry 810 can output power to a telematics monitoring device (such as telematics monitoring device 210 in FIGS. 2-7) by electrical pathway 1015, and can output power to peripheral devices by electrical pathway 1017. Whether provision of power from battery 830 by power circuitry 820 and control circuit 810 is enabled or disabled over each respective electrical pathway 1015 and 1017 can be controlled by control circuitry 810.

Figure 11:
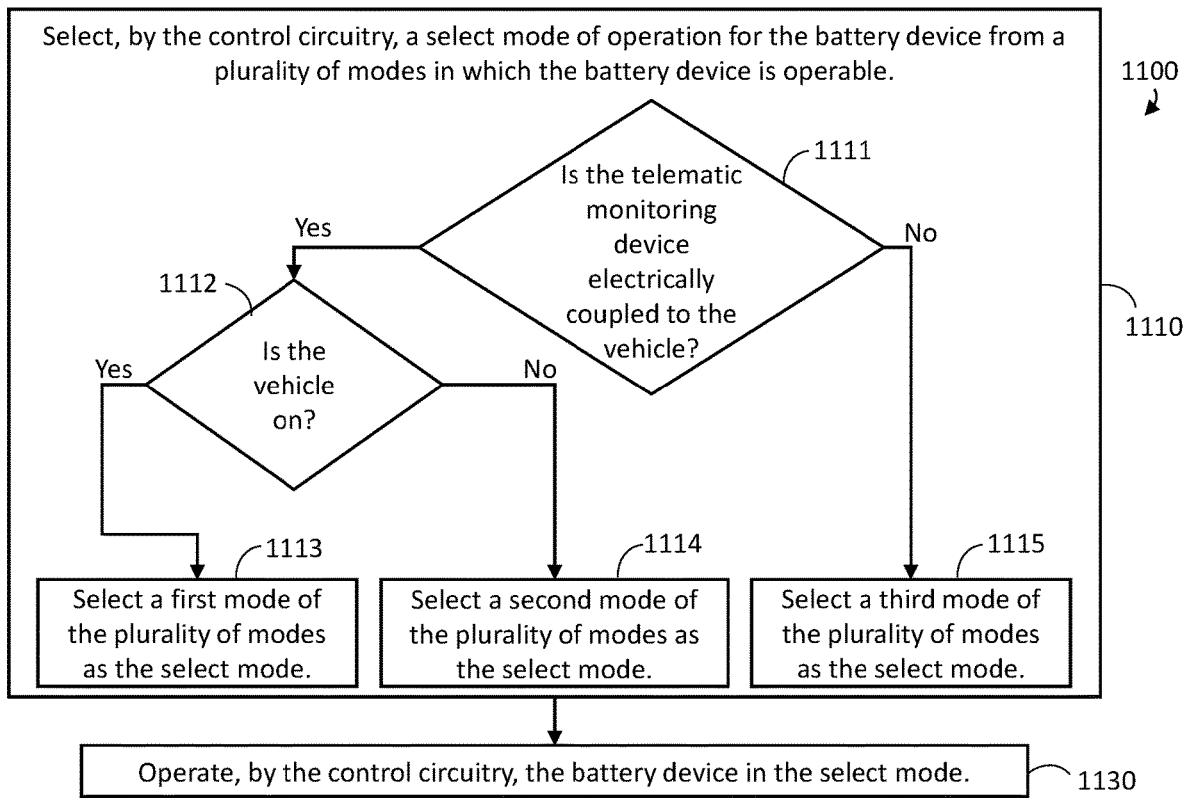
FIGS. 11 and 12 are flowchart diagrams of respective methods of operating battery devices, in accordance with at least two illustrated implementations.

FIG. 11 is a flowchart diagram which illustrates an exemplary method 1100 of operating any of the battery devices described herein. Method 1100 as illustrated includes acts 1110 and 1130, as well as sub acts 1111, 1112, 1113, 1114, and 1115. One skilled in the art will appreciate that additional acts could be added, acts could be removed, or acts could be reordered as appropriate for a given application. For example, although method 1100 illustrates a decision tree, the order of decisions could be altered, all of the decisions could be made sequentially, or a single selection of mode of operation could be made based on a combination of decision factors instead of a sequence of decisions. The discussion of FIG. 11 is applicable to telematic monitoring device 210 and battery device 220 as discussed with reference to any of FIGS. 2, 3, 4, 5, 6, and 7, as well as battery device 800, 900, and 1000, and control circuitry 810, power circuitry 820, and the at least one battery 830 as discussed with reference to any of FIG. 8, 9, or 10. The description is also applicable to any battery device having a similar structure. Any such battery devices could include at least one non-transitory processor-readable storage medium having instructions stored thereon, wherein the instructions when executed by the control circuitry cause the battery device to perform the method 1100.

In act 1110, the control circuitry 810 selects a mode of operation for the battery device from a plurality of modes in which the battery device is operable. Selection of a mode of operation of the battery device is based on whether the telematic monitoring device is electrically coupled to the vehicle (as shown by 1111) and whether the vehicle is on (as shown in 1112). If the telematic monitoring device is electrically coupled to the vehicle, and the vehicle is on, the control circuitry 810 selects a first mode of the plurality of modes as the select mode. If the telematic monitoring device is electrically coupled to the vehicle, and the vehicle is off, the control circuitry 810 selects a second mode from the plurality of modes as the select mode. If the telematic monitoring device is not electrically coupled to the vehicle, the control circuitry 810 selects a third mode of the plurality of modes as the select mode.

In act 1130, the control circuitry 810 operates the battery device in the select mode as selected in act 1110. FIGS. 13, 14, 15, and 16 discussed later describe different modes of the battery devices herein, and how operation in each mode differs.

Determining whether the telematic monitoring device is electrically coupled to the vehicle can be performed in any appropriate manner. In one implementation, the control circuitry 810 can check to see if power is available from the vehicle through the telematic monitoring device. If power is available, the telematic monitoring device is electrically coupled to the vehicle; if power is not available, the telematic monitoring device is not electrically coupled to the vehicle. In another implementation, the telematic monitoring device can be operable to detect a sudden drop in power supplied thereto from the vehicle. In response to a sudden drop in power, the telematic monitoring device can send a signal to the battery device indicating that the telematic monitoring device is disconnected from the vehicle. In another implementation, the telematic monitoring device can check whether any vehicle data is available or being transmitted over a connection to the vehicle (such as the OBDII port). If no data is available, the telematic monitoring device can send a signal to the battery device indicating that the telematic monitoring device is not electrically coupled to the vehicle.

Determining whether the telematic monitoring device is electrically coupled to the vehicle is not limited to determining whether the telematic monitoring device is completely coupled to the vehicle or completely disconnected from the vehicle. Rather, determining whether the telematic monitoring device is electrically coupled to the vehicle can also include determining whether the telematic monitoring device has a stable or reliable connection to the vehicle. For example, the telematic monitoring device may have become slightly loose, such that electrical coupling between the telematic monitoring device and the vehicle is inconsistent or unstable, even if the telematic monitoring device appears physically coupled to the vehicle.

Determining whether the vehicle is on can be performed in any appropriate manner. In one implementation, the telematic monitoring device can receive an "ignition" signal from the vehicle, which indicates whether the vehicle is on. In some cases, such an ignition signal can be indicative of a state of the vehicle ignition (e.g. where the vehicle key is turned to in the ignition); in other cases, the "ignition signal" can be construed more broadly to refer to an operational state of the vehicle (e.g.: off, electrical components on and engine off, and engine on). In some examples, this signal can be provided to the battery device for analysis. In other examples, the signal can be analyzed by a processing unit of the telematic monitoring device to determine an operational state of the vehicle, and the telematic monitoring device in turn sends a signal to the battery device indicative of whether the vehicle is on.

In other implementations, the telematic monitoring device or the battery device can measure voltage (e.g. collect voltage measurement data) of power from the vehicle. Measurement of voltage or collection of voltage measurement data could be performed by any appropriate means, such as a voltage measurement circuit or a voltmeter, as non-limiting examples. Voltage measurement means could be built into the telematic monitoring device or the battery device, or could be an external unit which provides voltage measurement data to the telematic monitoring device or the battery device. The measured voltage can be indicative of the vehicle being on. For example, when a vehicle is not on, a vehicle battery can have a voltage of approximately 12V. When the vehicle is on and the vehicle battery is being charged by an alternator, the vehicle battery voltage can be higher, such as approximately 14V. If the measured voltage is higher than an expected rest voltage (e.g. if the measured voltage is 14V instead of 12V), the telematic monitoring device or the battery device can determine that the vehicle is on. The measured voltage can also be indicative of an ignition event of a vehicle (e.g. the engine being cranked in a combustion engine). This is because vehicle battery voltage fluctuates during such an ignition event. If the measured voltages indicate such fluctuation, the telematic monitoring device or the battery device can determine that the vehicle was turned on.

In yet other implementations, the telematic monitoring device or the battery device can have at least one sensor on board, and processing circuitry of the telematic monitoring device or the control circuitry of the battery device can analyze data from the at least one sensor to determine whether the vehicle is on. This is discussed in more detail later with reference to FIG. 17.

In yet other implementations, determining whether a vehicle is on can be performed by detecting that the vehicle is in motion (for example as discussed later with reference to FIGS. 12, 17, and 18), and inferring that the vehicle is on when the vehicle is in motion. For example, location data from a location sensor of the telematic monitoring device, battery device, or a peripheral device indicates motion thereof corresponding to motion of a vehicle. A processing unit of said telematic monitoring device, battery device, or peripheral device can receive said location data, detect that the vehicle is moving, and subsequently infer that the vehicle is on.

Analysis of data by the telematic monitoring device, the battery device, or any peripheral devices can be performed by a respective processing unit of the component doing the processing (for example the control circuitry of a battery device, or a separate processing unit in the battery device, or a processing unit in the telematic monitoring device or peripheral device).

Figure 12:
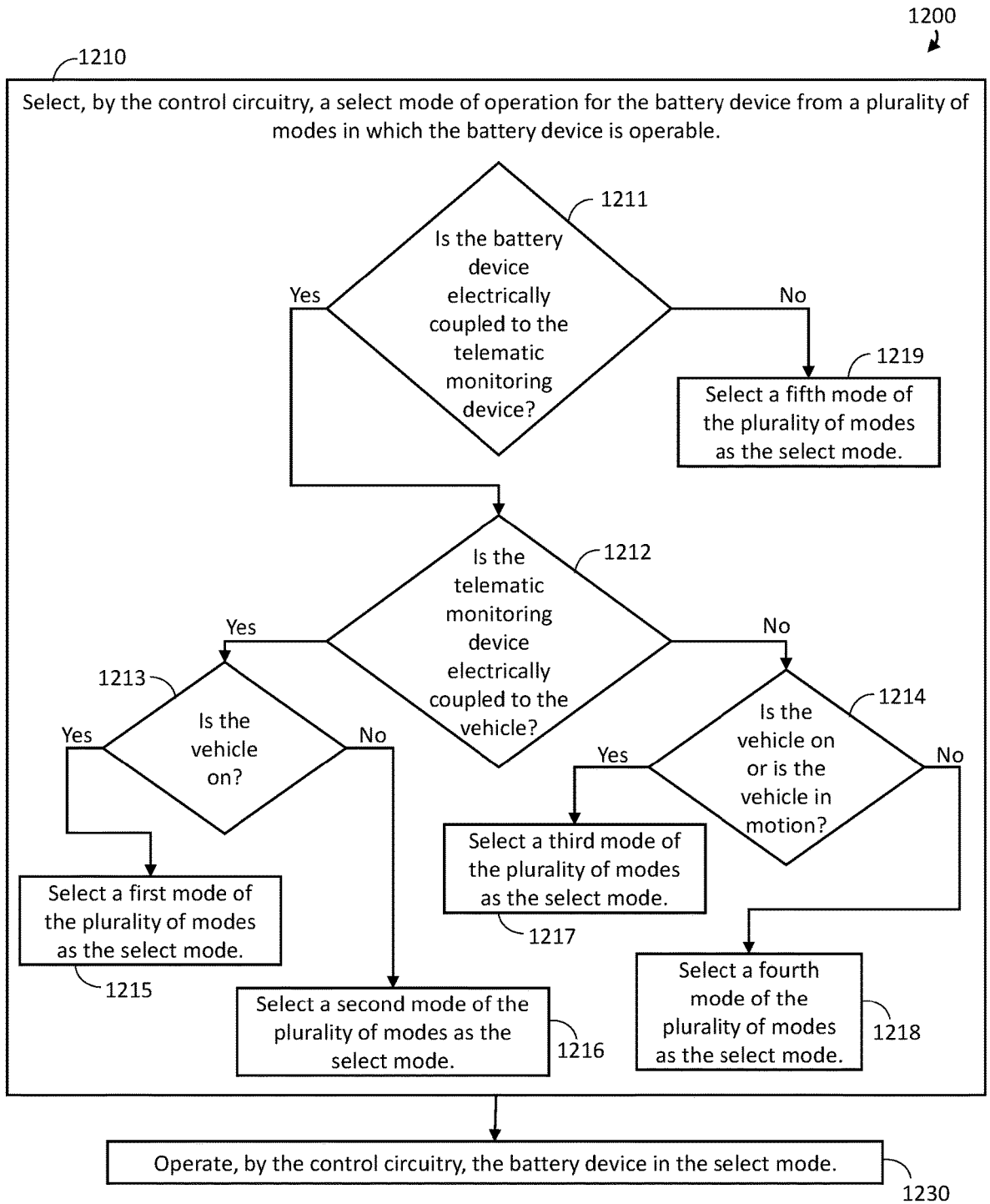

FIG. 12 is a flowchart diagram which illustrates an exemplary method 1200 of operating any of the battery devices described herein. Method 1200 in FIG. 12 is similar to method 1100 in FIG. 11, and description of method 1100 is applicable to method 1200 unless context dictates otherwise. Method 1200 as illustrated includes acts 1210 and 1230, as well as sub-acts 1211, 1212, 1213, 1214, 1215, 1216, 1217, 1218, and 1219. One skilled in the art will appreciate that additional acts could be added, acts could be removed, or acts could be reordered as appropriate for a given application. For example, although method 1200 illustrates a decision tree, the order of decisions could be altered, the decisions could be made simultaneously, or a single selection of mode of operation could be made based on a combination of decision factors instead of a sequence of decisions. The discussion of FIG. 12 is applicable to telematic monitoring device 210 and battery device 220 as discussed with reference to any of FIGS. 2, 3, 4, 5, 6, and 7, as well as battery device 800, 900, and 1000, and control circuitry 810, power circuitry 820, and the at least one battery 830 as discussed with reference to any of FIG. 8, 9, or 10. The description is also applicable to any battery device having a similar structure. Any such battery devices could include at least one non-transitory processor-readable storage medium having instructions stored thereon, wherein the instructions when executed by the control circuitry cause the battery device to perform the method 1200.

In act 1210, the control circuitry 810 selects a select mode of operation for the battery device from a plurality of modes in which the battery device is operable. This is similar to act 1110 in FIG. 11, but act 1210 illustrates more sub-acts and modes. Selection of a mode of operation of the battery device is based on whether the battery device is electrically coupled to the telematic monitoring device (as shown by 1211), whether telematic monitoring device is electrically coupled to the vehicle (as shown by 1212) and whether the vehicle is on or in motion (as shown by 1213 and 1214). If the battery device is electrically coupled to the telematic monitoring device, the telematic monitoring device is electrically coupled to vehicle, and the vehicle is on, the control circuitry 810 selects a first mode of the plurality of modes as the select mode, as shown in act 1215. If the battery device is electrically coupled to the telematic monitoring device, the telematic monitoring device is electrically coupled to vehicle, and the vehicle is NOT on, the control circuitry 810 selects a second mode of the plurality of modes as the select mode, as shown in act 1216. If the battery device is electrically coupled to the telematic monitoring device, the telematic monitoring device is NOT electrically coupled to vehicle, and the vehicle is on or the vehicle is in motion, the control circuitry 810 selects a third mode of the plurality of modes as the select mode, as shown in act 1217. If the battery device is electrically coupled to the telematic monitoring device, the telematic monitoring device is NOT electrically coupled to vehicle, and the vehicle is NOT on or the vehicle is in NOT motion, the control circuitry 810 selects a fourth mode of the plurality of modes as the select mode, as shown in act 1218. If the battery device is NOT electrically coupled to the telematic monitoring device, the control circuitry 810 selects a fifth mode of the plurality of modes as the select mode, as shown in act 1219.

The inclusion of the fifth mode, and thus sub-acts 1211 and 1219, are optional in the context of FIG. 12.

In act 1230, the control circuitry 810 operates the battery device in the select mode as selected in act 1210. FIGS. 13, 14, 15, and 16 discussed later describe different modes of the battery devices herein.

Determining whether the battery device is electrically coupled to the telematic monitoring device can be performed in any appropriate manner. In one implementation, the control circuitry 810 can check to see if power is available to battery device 220 from the vehicle through the telematic monitoring device 210 (for arrangements like those in FIGS. 2, 3, 4, 5, and 6). If power is available, the battery device 220 is electrically coupled to the telematic monitoring device 210; if power is not available, battery device 220 may not be electrically coupled to the telematic monitoring device 210, or the telematic monitoring device 210 may not be electrically coupled to the vehicle. In another implementation, the battery device 220 can be operable to detect a sudden drop in power supplied thereto from the telematic monitoring device 210. In response to a sudden drop in power, battery device 220 can determine that the battery device 220 has been disconnected from the telematic monitoring device 210, or the telematic monitoring device 210 has been disconnected from the vehicle. In implementations where lack or loss of power to battery device 220 can mean that either the telematics monitoring device 210 is disconnected from the vehicle or that battery device 220 is disconnected from telematics monitoring device 210, communication data can be exchanged between telematic monitoring device 210 and battery device 220 to determine what is disconnected. In another implementation, status data can be provided from the telematic monitoring device 210 to the battery device 220 indicating the status of connection between the vehicle and telematic monitoring device 210. If no status data is received by battery device 220, control circuitry 810 can determine that the battery device is not electrically coupled to the telematic monitoring device.

Determining whether the battery device is electrically coupled to the telematic monitoring device can be performed by any appropriate means. In one non-limiting example, periodic messages are exchanged between the battery device and the telematic monitoring device. When the battery device doesn't receive an expected periodic message, the battery device (or control circuitry 810 of the battery device) can determine that the battery device is not electrically coupled to the telematic monitoring device. In another non-limiting example, the battery device (e.g. by control circuitry 810) can probe electrical pathways to the telematic monitoring device, and determine that the battery device is not coupled to the telematic monitoring device if the electrical pathways are not available.

Determining whether the telematic monitoring device is electrically coupled to the vehicle can be performed in any appropriate manner, as is discussed above with reference to FIG. 11. Determining whether the vehicle is on or in motion can also be performed in any appropriate manner, as discussed above with reference to FIG. 11 and below with reference to FIGS. 17 and 18.

Similarly to as discussed above with reference to FIG. 11, determining whether components are electrically coupled is not limited to determining whether the components are completely coupled or completely disconnected. Rather, determining whether components are electrically coupled can also include determining whether the components have a stable or reliable connection.

FIGS. 13, 14, 15, and 16 are schematic diagrams of exemplary modes of operation of any of the battery devices described herein. FIGS. 13, 14, 15, and 16 illustrate which of the illustrated electrical pathways are available for provision of power in a given mode of operation. Pathways which are available are indicated by a circle "O", whereas pathways which are not available are indicated by a cross "X". Note that a pathway being unavailable does not indicate that the pathway is not present, but rather that the pathway is disabled or is not used in the illustrated mode. Further, as discussed above, a single pathway can be representative of multiple pathways, and likewise multiple illustrated pathways can be combined in a single pathway (including a multi-directional pathway). FIGS. 13, 14, 15, and 16 generally focus on illustrating whether pathways by which power is provided (pathways illustrated as solid lines) are available or not in a given mode. Pathways by which control data or signals are transmitted are generally available to enable control of components for changing between modes. Unless context dictates otherwise, pathways not labelled with a circle or a cross can be enabled or disabled as appropriate for a given application (that is, the specific mode does not necessarily dictate whether pathways not labelled with a circle or a cross are available or not). FIGS. 13, 14, 15, and 16 show modes of operation as they pertain to battery device 900 in FIG. 9; however, the discussion applies to other implementations of battery devices, such as battery device 800 in FIG. 8, battery device 1000 in FIG. 10, or any other appropriate battery device implementation. In cases where a specific pathway discussed in FIG. 13, 14, 15, or 16 is not present in a particular battery device implementation, the function of the pathway (i.e. to where the pathway provides power) is still applicable to said implementation.

Figure 13:
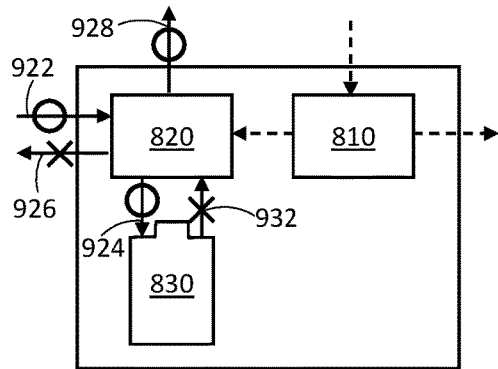
FIGS. 13, 14, 15, and 16 are schematic diagrams of respective modes of operation of battery devices, in accordance with at least five illustrated implementations.

FIG. 13 illustrates a first mode of operation, which corresponds to the first mode of operation in FIGS. 11 and 12. In this first mode, pathway 922 is available for provision of power from a vehicle to power circuitry 820. Pathway 924 is also available for provision of power from power circuit 820 to the at least one battery 830. Pathway 928 is also available for provision of power to any peripheral devices electrically coupled to the battery device. Stated differently, in the first mode, the battery device receives power from the vehicle, provision of power from the battery device to at least one peripheral device is enabled, and provision of power to the at least one battery 830 for charging is enabled.

Pathway 926 is generally not used in the first mode, as pathway 926 is for provision of power from the battery device to a telematic monitoring device (which is generally already powered by the vehicle when the battery device is receiving power). Pathway 932 is also not generally used in the first mode, as this pathway is generally used for the at least one battery 830 to provide power to other components like the telematic monitoring device or peripheral devices (which are already receiving power from the vehicle).

As discussed with reference to FIGS. 11 and 12 above, the battery device operates in the first mode when the telematic monitoring device is electrically coupled to the vehicle, and the vehicle is on. In such a case, the vehicle is capable of charging its own battery (e.g. by an alternator in the case of an internal combustion engine), or is dependent on a high capacity battery (in the case of a battery electric vehicle), and so a large or regenerating quantity of power is available to the telematic monitoring device and the battery device. As such, high power drain functions like charging the at least one battery 830 are enabled. Note that the first mode does not require that the at least one battery 830 is actually being charged all the time; rather provision of power to the at least one battery 830 for charging is enabled, but charging may only occur when necessary (e.g. when the at least one battery 830 is not fully charged or the available energy in the at least one battery 830 drops below a threshold).

Figure 14:
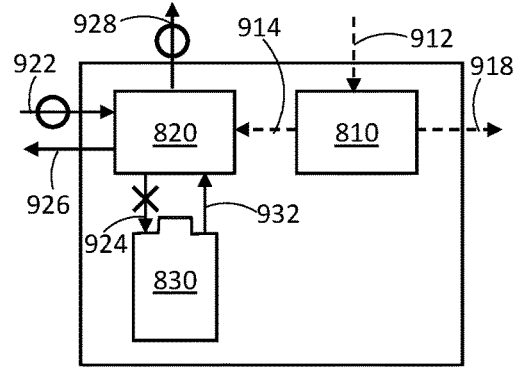

FIG. 14 illustrates a second mode of operation, which corresponds to the second mode of operation in FIGS. 11 and 12. In this second mode, pathway 922 is available for provision of power from a vehicle to power circuit 820. Pathway 928 is also available for provision of power to any peripheral devices electrically coupled to the battery device. However, pathway 924 is not available for provision of power from power circuit 820 to the at least one battery 830. Stated differently, in the second mode, the battery device receives power from the vehicle, provision of power from the battery device to at least one peripheral device is enabled, and provision of power to the at least one battery 830 for charging is disabled.

As discussed with reference to FIGS. 11 and 12 above, the battery device operates in the second mode when the telematic monitoring device is electrically coupled to the vehicle, and the vehicle is NOT on. In such a case, the vehicle is NOT capable of charging its own battery (in the case of an internal combustion engine vehicle), and reliance on a high-capacity battery may not be available (in the case of a battery electric vehicle). As such, excessive drain on a battery of the vehicle may prevent the vehicle from starting or being able to drive in the future, and so drain on the vehicle battery should be limited. As such, high power drain functions like charging the at least one battery 830 by electrical pathway 924 are disabled. However, low power functions like the telematic monitoring device sending occasional data, or operating peripheral devices in low power mode can be enabled, hence why pathways 922 and 928 are available. To facilitate this, after determining or receiving an indication of whether the vehicle is on, control circuitry 810 can communicate with peripheral devices via pathway 918 and with power circuitry 820 to instruct these peripheral devices or components to operate in a low power mode.

Pathways 932 and 926 are optionally available for use in the second mode. In the event power in the vehicle battery is low or limited, the at least one battery 830 can provide power to the telematics monitoring device and/or to peripheral devices via power circuitry 820 to enable operation thereof in the low power mode.

Figure 15:
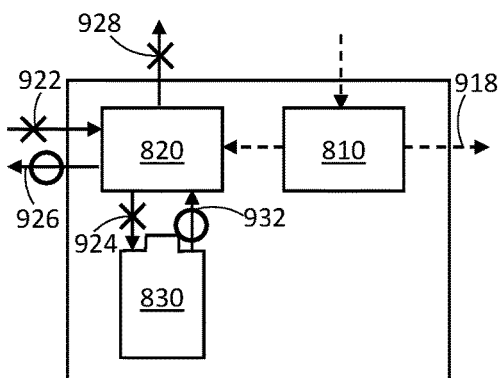

FIG. 15 illustrates a third mode of operation, which corresponds to the third mode of operation in FIGS. 11 and 12. Additionally, FIG. 15 also illustrates a fourth mode of operation, which corresponds to the fourth mode of operation in FIG. 12. The third and fourth modes of operation are similar, in that similar electrical pathways are available for provision of power. However, the third and fourth modes of operation differ in terms of quantity of power provided, as is discussed later.

In the third and fourth modes, power is not provided to the battery device by pathway 922. Pathway 924 is not available for power circuit 820 to provide power to the at least one battery 830. However, pathway 932 is available for the at least one battery 830 to provide power to the power circuit 820. Pathway 926 is available for provision of power from power circuit 820 to the telematic monitoring device. Pathway 928 is illustrated as not available for provision of power to peripheral devices electrically coupled to the battery device; however this is optional. In some implementations, pathway 928 can be available for provision of power to peripheral devices electrically coupled to the battery device. Stated differently, in the illustrated third mode and the fourth mode, the battery device does not receive power from the vehicle, provision of power from the battery device to the telematic monitoring device is enabled, provision of power from the battery device to at least one peripheral device is disabled, and provision of power to the at least one battery 830 for charging is disabled. As mentioned above, optionally provision of power from the battery device to at least one peripheral device can be enabled.

One difference between the third mode and the fourth mode is the quantity of power provided to the telematic monitoring device. In FIG. 12 discussed above, the third mode is entered when the battery device is electrically coupled to the telematic monitoring device, the telematic monitoring device is NOT electrically coupled to the vehicle, and when the vehicle is on or is in motion. This scenario can happen if the vehicle is in use but the telematics monitoring device is at least partially unplugged from the vehicle or has an unstable connection to the vehicle. In such a scenario, it can be desirable for the telematic monitoring device to continue performing telematic monitoring and/or communication with a network. To this end, the battery device provides sufficient power from the at least one battery 830 to operate the telematic monitoring device in a full power mode (that is, essentially the same amount of power is available to the telematic monitoring device as if the telematic monitoring device were receiving power from the vehicle). Because the telematic monitoring device is disconnected from the vehicle or the connection to vehicle is unstable, vehicle data may not be received by the telematic monitoring device. As such the telematic monitoring device may not process such data, and thus may not consume power for such processing. In this sense, the "full power mode" of the telematic monitoring device as used when the battery device is operating in the third mode may not exactly match a mode or power consumption of the telematic monitoring device when electrically coupled to the vehicle.

To conserve battery life for the at least one battery 830 in the third mode, provision of power to peripheral devices can be disabled. On the other hand, if the performance of the peripheral devices is desired for a given application, power can be provided to the peripheral devices from battery 830 by pathway 928. If selective operation of a limited number of peripheral devices is desired (or limitation of peripheral devices to only certain functionality), control information can be sent from control circuitry 810 to the appropriate peripheral devices over pathway 918, to instruct the appropriate peripheral devices to operate in a low power mode or to shut-off.

In FIG. 12 discussed above, the fourth mode is entered when the battery device is electrically coupled to the telematic monitoring device, the telematic monitoring device is NOT electrically coupled to the vehicle, and when the vehicle is NOT on or is NOT in motion. This scenario can happen if the vehicle is not in use and the telematics monitoring device is at least partially unplugged from the vehicle or has an unstable connection to the vehicle. In such a scenario, it can be desirable for the telematic monitoring device to continue performing low power functions like telematic monitoring device sending occasional data, or optionally operating peripheral devices in a low power mode can be enabled. To this end, in the fourth mode the battery device may provide a limited amount of power to the telematic monitoring device, this limited amount of power being sufficient for the telematic monitoring device to operate in a low power mode which consumes less power than the full power mode. In an exemplary low power mode, the telematic monitoring device can normally be in a sleep state which consumes little power, and periodically (e.g. every 30 minutes, though other time frames are possible) enters a wake state to check if a status of the telematic monitoring device has changed or if new data needs to be communicated over a network. This type of operation can be referred to as "heartbeat" operation.

In the example of FIG. 11 above, where there is no fourth mode, the third mode can comprise the battery device providing an appropriate amount of power to the telematic monitoring device, as determined for a specific application. For example, the battery device could provide sufficient power for the telematic monitoring device to operate in the full power mode, or could provide sufficient power for the telematic monitoring device to operate in the low power mode discussed above.

Figure 16:
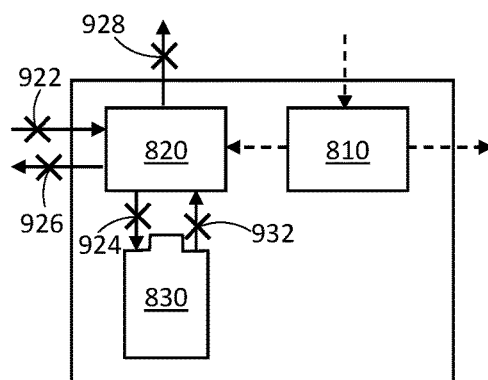

FIG. 16 illustrates an optional fifth mode of operation, which corresponds to the fifth mode of operation in FIG. 12. In this fifth mode, generally provision of power is disabled. In particular, pathways 922, 924, 926, 928, and 932 are not available for provision of power. Pathways 922, 926, and 928 may not be available because the battery device is not electrically coupled to a telematic monitoring device or to a peripheral device. Pathways 924 and 932 may be disabled, such as with relays, switches, or other logic, to prevent transmission of power to and from the at least one battery 830. Pathways 922, 926, and 928 may be technically available, but are unused (because they are from transmission of power to and from devices external to the battery device). Connecting to other devices by pathways 922, 926, and 928 may cause the battery device to select a new mode of operation. Stated differently, in the fifth mode, provision of power at least from the at least one battery 830 is disabled.

The fifth mode is useful to bring power loss of the at least one battery 830 to as close to zero as possible. For example, during shipping or storage, it is desirable for the at least one battery 830 to not lose power. By restricting provision of power, the fifth state advantageously reduces power loss.

Figure 17:
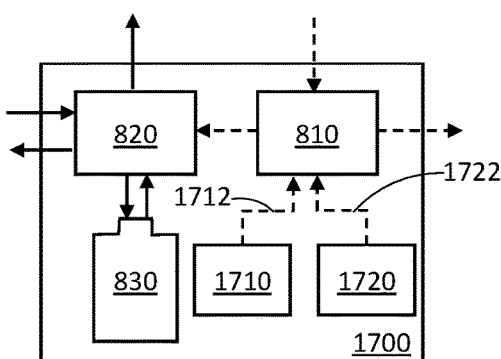
FIG. 17 is a schematic diagram of an exemplary battery device having onboard sensors.

FIG. 17 is a schematic diagram of an exemplary battery device 1700. Battery device 1700 is similar to battery devices 800, 900, and 1000 discussed with reference to FIGS. 8, 9, and 10, and description of battery devices 800, 900, and 1000 applies to battery device 1700 unless context dictates otherwise. One difference between battery device 1700 and battery devices 800, 900, and 1000 is that battery device 1700 is shown as including two sensors 1710 and 1720. Fewer or more sensors could be included as appropriate for a given application. Sensor data from sensors 1710 and 1720 can be provided to control circuitry 810 over electrical pathways 1712 and 1722, respectively. Based on the sensor data, control circuitry 810 can choose a mode of operation of battery device 1700.

In one example, sensor 1710 can be a location sensor, such as a GPS sensor, and sensor 1720 can be an accelerometer or IMU (inertial measurement unit). Sensor data from sensor 1710 and/or sensor 1720 can be used to determine a state of a vehicle. For example, if location data from sensor 1710 indicates that the location of the GPS sensor is changing, it can be determined that the vehicle is moving. As another example, the rate of change of the vehicle's position can be used to determine the speed of the vehicle (which also indicates the vehicle is moving). As yet another example, if sensor data from an accelerometer (sensor 1720) indicates an acceleration (for a long enough period of time or over a threshold), it can be determined that the vehicle is moving. As yet another example, if sensor data from an accelerometer (sensor 1720) indicates that the accelerometer is vibrating or shaking, it can be determined that the vehicle is on (since engines can cause a vehicle to vibrate or shake).

Other types of sensors are possible, for example gyroscopes, image sensors, audio sensors, or any other appropriate type of sensor could be used. For example, an image sensor could capture image data which shows a changing environment or scenery of the vehicle, which is indicative of movement of the vehicle. As another example, an audio sensor could capture audio data which includes sound made by the engine of the vehicle, which indicates the vehicle is on. As yet another example, an audio sensor could capture audio data which includes sound made by acceleration or movement of the vehicle (such as engine throttling noise, road noise, or wind noise), which indicates the vehicle is in motion. Collectively, such noise can be referred to as movement noise.

In some implementations, sensors 1710 and 1720 are not included in a battery device, but are instead included in a telematic monitoring device. In some examples, data from said sensor can be sent to the battery device for processing by control circuitry 810. In other examples, data from the sensors is processed by a processing unit on the telematic monitoring device, and outputs indicating the state of the vehicle are provided to the battery device. This is discussed with reference to FIG. 18 below.

In some other implementations, sensors 1710 and 1720 are not included in a battery device, but are instead included in at least one peripheral device electrically coupled to the battery device. In some examples, data from said sensor can be sent to the battery device for processing by control circuitry 810. In other examples, data from the sensors is processed by a processing unit on the respective peripheral device, and outputs indicating the state of the vehicle are provided to the battery device. This is discussed with reference to FIG. 18 below.

As mentioned above, a determination of whether a vehicle is in motion can be used to infer whether the vehicle is on. That is, if it is determined using any of the above discussed techniques that the vehicle is in motion, a processing unit of the telematic monitoring device, battery device, or peripheral device can infer that the vehicle is on.

Figure 18:
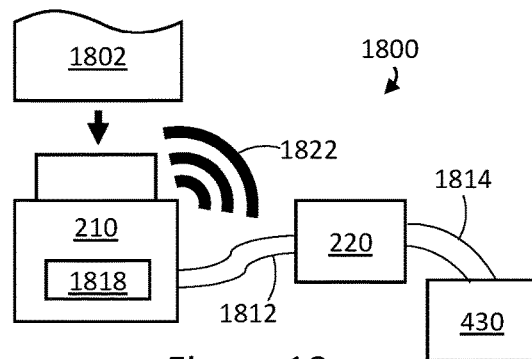
FIG. 18 is a schematic diagram of an onboard telematic system operable to couple to a vehicle port.

FIG. 18 is a schematic diagram of an onboard telematic monitoring system 1800. Telematic monitoring system includes a telematic monitoring device 210 (similar to as described with reference to FIGS. 2, 3, 4, 5, 6, and 7) which is operable to electrically couple to a port 1802 of a vehicle. Port 1802 can be for example an OBDII port, and can provide vehicle data and power to telematic monitoring device 210. Telematic monitoring system 1800 also includes a battery device 220 (similar to as described with reference to FIGS. 2, 3, 4, 5, 6, and 7) electrically coupled to telematic monitoring device 210 by electrical pathway 1812. Unless context dictates otherwise, descriptions of any of the telematic monitoring devices discussed herein are applicable to telematic monitoring device 210 in FIG. 18, and descriptions of any of the battery devices described herein are applicable to battery device 220 in FIG. 18.

FIG. 18 illustrates a scenario where telematic monitoring device 210 is removed from port 1802. Prior to removal, battery device 220 can operate in a first mode (corresponding to the first mode described with reference to FIG. 13) or a second mode (corresponding to the second mode described with reference to FIG. 14) where telematic monitoring device 210 receives power from the vehicle and provides power to battery device 220. In response to the removal, the battery device switches to the third or fourth mode (corresponding to the third or fourth modes described with reference to FIG. 15) depending on the state of the vehicle, where the battery device 220 provides power to telematic monitoring device 210. Because telematic monitoring device 210 is receiving power after being disconnected from the vehicle, telematic monitoring device 210 can communicate an alert or signal which indicates that the telematic monitoring device is disconnected from the vehicle. Such an alert could be audible, so that an operator of the vehicle knows to reconnect the telematic monitoring device 210 to the vehicle. Alternatively or additionally, said alert can be communicated over a network (shown as 1822) to a telematics system (such as telematics subsystem 102 in FIG. 1). In this way, battery device 220 enables understanding and response by operators or administrators to a disconnected telematics monitoring device.

In another implementation, control circuitry of battery device 220 detects when power to the battery device 220 is disconnected (e.g. if telematic monitoring device 210 is removed from port 1802, so power is not provided to telematic monitoring device 210). In response to losing power, the control circuitry of battery device 220 instructs the telematic monitoring device 210 to transmit a signal (e.g. 1822, audible or electronic) indicative of disconnection of power when power to the battery device is disconnected. Optionally, the control circuitry of battery device 220 can also detect whether battery device 220 is electrically coupled to telematic monitoring device 210, and only send the instruction to the telematic monitoring device 210 if battery device 220 and telematic monitoring device 210 are electrically coupled.

FIG. 18 also illustrates at least one sensor 1818 in the telematic monitoring device 210. The at least one sensor could include any of a location sensor, an accelerometer, an IMU, gyroscopes, image sensors, audio sensors, or any other appropriate type of sensor, similar to as described above with reference to FIG. 17. The at least one sensor collects sensor data which can be used to determine whether the vehicle is on or in motion, similar to as discussed with reference to FIG. 17 above. In some implementations, the sensor data can be processed by a processing unit of telematic monitoring device 210, and status data or a signal indicating whether the vehicle is on or in motion can be sent to battery device 220 over electrical pathway 1812. In other implementations, the sensor data can be sent to battery device 220 over electrical pathway 1812, to be processed by control circuitry on battery device 220 to determine whether the vehicle is on or is in motion.

FIG. 18 also illustrates at least one peripheral device 430 (similar to as discussed with reference to FIGS. 4, 5, 6, and 7) electrically coupled to the battery device 220 by electrical pathway 1814. The peripheral device 430 can be or can include at least one sensor such as any of a location sensor, an accelerometer, an IMU, gyroscopes, image sensors, audio sensors, or any other appropriate type of sensor, similar to as described above with reference to FIG. 17. The at least one sensor collects sensor data which can be used to determine whether the vehicle is on or in motion, similar to as discussed with reference to FIG. 17 above. In some implementations, the sensor data can be processed by a processing unit of peripheral device 430, and status data or a signal indicating whether the vehicle is on or in motion can be sent to battery device 220 over electrical pathway 1814. In other implementations, the sensor data can be sent to battery device 220 over electrical pathway 1814, to be processed by control circuitry on battery device 220 to determine whether the vehicle is on or is in motion.

Figure 19:
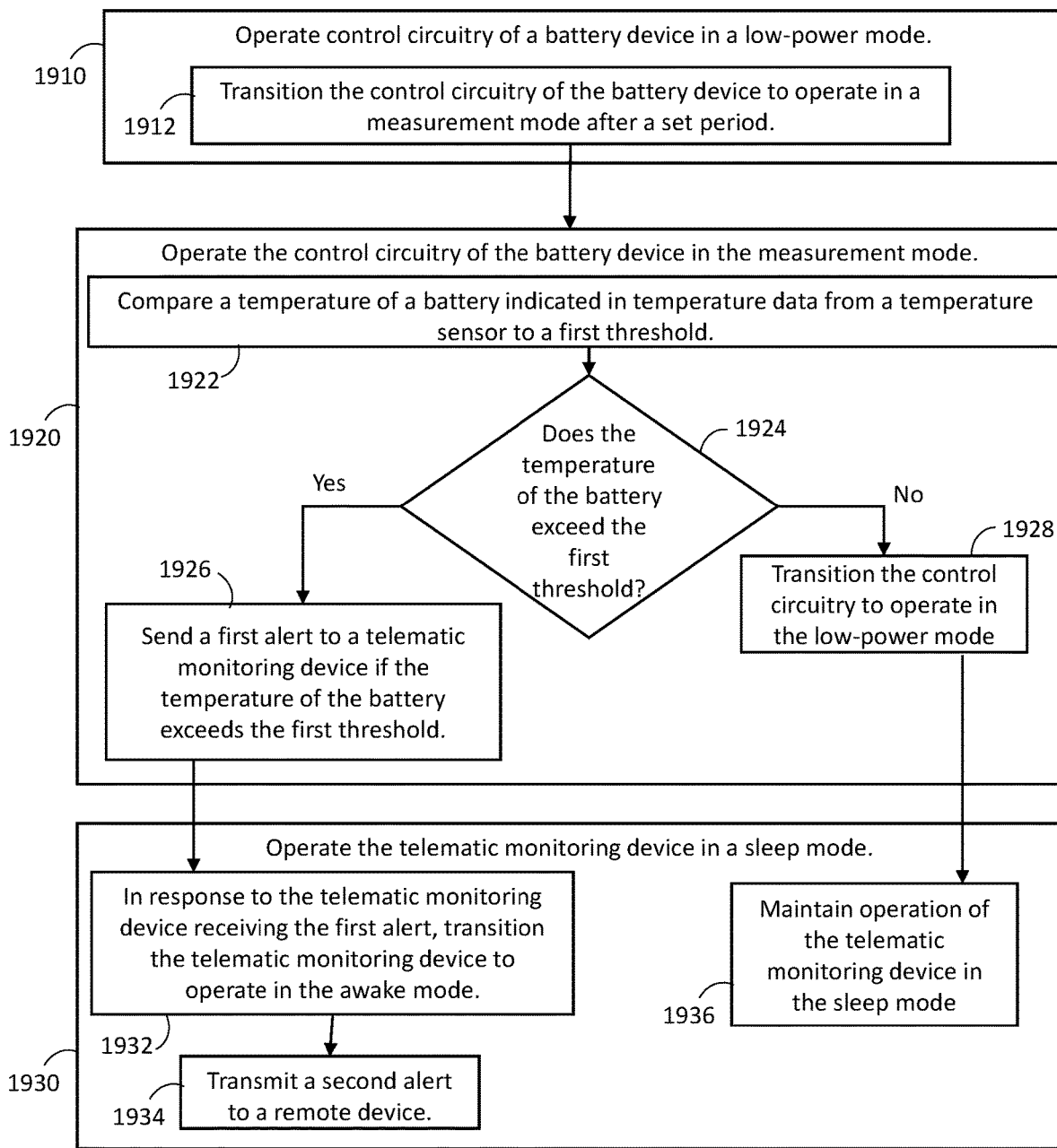
FIGS. 19 and 20 are flowchart diagrams of respective methods of operating telematic monitoring devices and battery devices, in accordance with at least two illustrated implementations.
Figure 20:
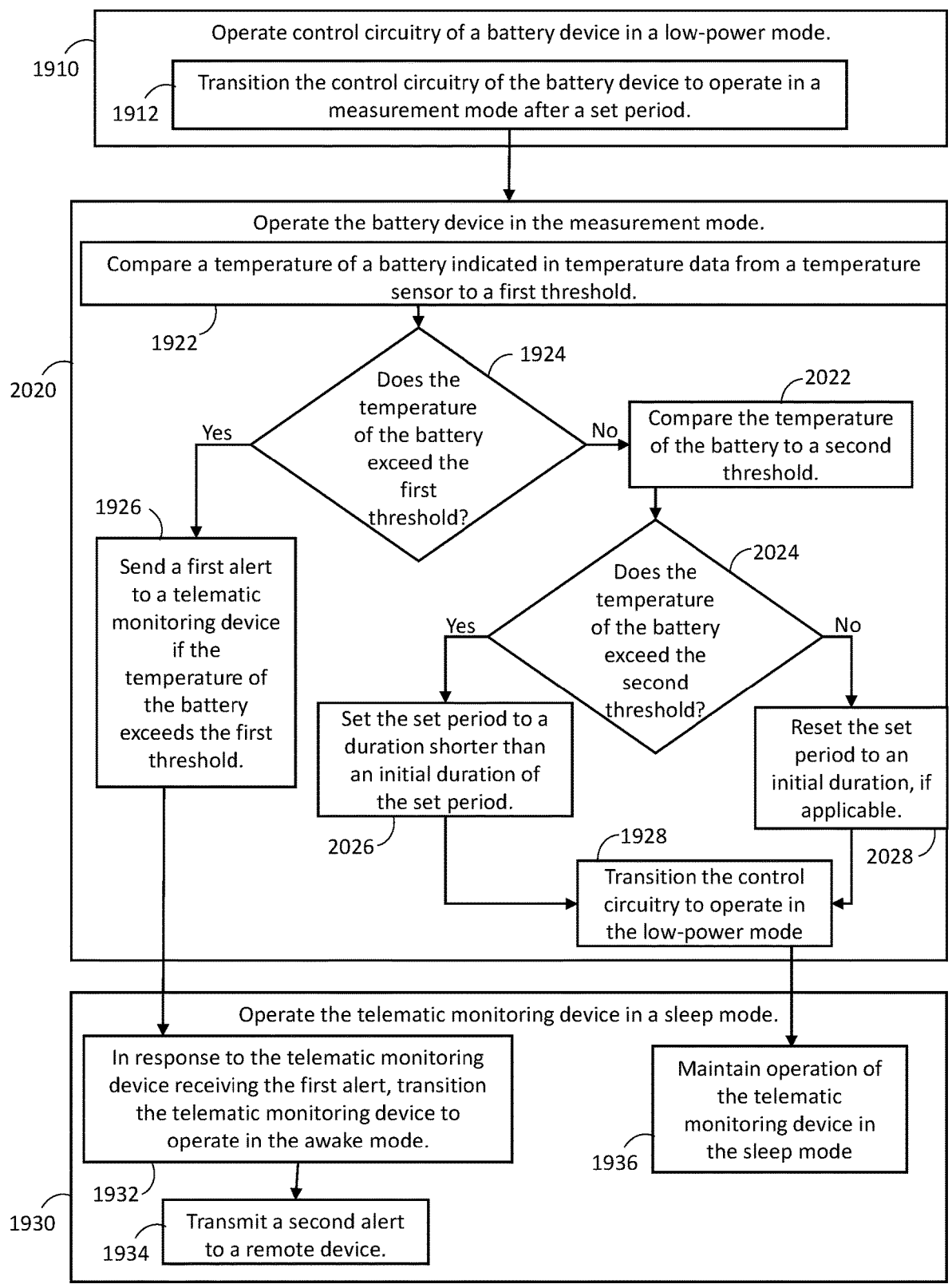

Batteries have been known to overheat on rare occasions, even when they are seemingly not being used to a high degree. This can result in fire, damage to surrounding elements, and physical injury to persons. It is desirable to be able to detect when such a situation is about to occur or is occurring, so that preventative or mitigative measures can be taken. For example, if an overheating condition is detected in a battery positioned in an unattended vehicle, a service person or emergency responder can be notified of this overheating condition, such that they could potentially isolate the battery to prevent fire, or put out a fire which has occurred, before significant injury or damage occurs. However, constantly measuring and reporting battery temperature consumes power, which could result in excessive drain on the vehicle battery or a battery device in the vehicle. This can lead to failure of the vehicle to start when needed, or inability for the battery device to provide backup power when needed. Therefore, it is further desirable to achieve the above discussed temperature monitoring, but to also do so with minimal power consumption. FIGS. 19 and 20, and the corresponding discussion below, are directed to this.

FIG. 19 is a flowchart diagram which illustrates another exemplary method 1900 of operating any of the battery devices and/or telematic monitoring devices described herein. Method 1900 as illustrated includes acts 1910, 1920, and 1930, as well as sub-acts 1912, 1922, 1924, 1926, 1928, 1932, 1934, and 1936. One skilled in the art will appreciate that additional acts could be added, acts could be removed, acts could be reordered, or acts could be combined as appropriate for a given application. For example, although method 1900 illustrates a decision tree, the order of decisions could be altered or the decisions could be made simultaneously. As another example, acts 1910, 1920, and 1930 generally express operation of the battery device or telematic monitoring device in certain modes; these acts could be expressed in combination with corresponding sub-acts 1912, 1922, 1924, 1926, 1928, 1932, 1934, and 1936 (e.g. 1910, 1920, or 1930 can be a state in which corresponding sub-acts are performed). The discussion of FIG. 19 is applicable to telematic monitoring device 210 and battery device 220 as discussed with reference to any of FIGS. 2, 3, 4, 5, 6, and 7, as well as battery device 800, 900, and 1000, and control circuitry 810, power circuitry 820, and the at least one battery 830 as discussed with reference to any of FIG. 8, 9, or 10. The description is also applicable to any battery device having a similar structure. Any such battery devices could include at least one non-transitory processor-readable storage medium having instructions stored thereon, wherein the instructions when executed by the control circuitry cause the battery device to perform appropriate acts of method 1900. Further, any appropriate telematic monitoring device could include at least one non-transitory processor-readable storage medium having instructions stored thereon, wherein the instructions when executed by at least one processor of the telematic monitoring device cause the telematic monitoring device to perform appropriate acts of method 1900.

At 1910, the control circuitry of the battery device is operated in a low-power mode. In this low-power mode, the control circuitry is generally inactive to reduce power consumption. At 1912, during operation of the control circuitry in the low-power mode, the control circuitry transitions to operate in a measurement mode (discussed later) after a set period. For example, in the low-power mode the control circuitry can maintain a clock, and when a set period of time passes the control mode transitions itself to operate in the measurement mode. The set period can occur repeatedly, so that the control circuitry transitions to operate in the measurement mode and transitions back to the low-power mode (as discussed later with reference to act 1920), to wait another set period until transitioning to the measurement mode again.

At 1920, the control circuitry of the battery device operates in a measurement mode. The measurement mode generally refers to a mode in which temperature data for the battery collected by a temperature sensor of the battery device is measured, to determine whether there is a battery temperature problem (or potential problem). At 1922, a temperature of the battery included in the battery device, as indicated in temperature data collected by the temperature sensor of the battery device, is compared to a first threshold. The first threshold is preferably set to correspond to a temperature which the battery would not reach under normal circumstances, and is indicative of an overheating condition of the battery. As an example, the first threshold could be set at 80° C., though any appropriate threshold value could be set. At 1924, a determination is made based on whether the temperature of the battery exceeds the first threshold. In some implementations, 1922 and 1924 could be combined or considered as a single act.

If the temperature of the battery exceeds the first threshold at 1924, the battery device sends a first alert to a telematic monitoring device at 1926 (e.g. by an electrical coupling or communication interface between the battery device and the telematic monitoring device). At 1930, the telematic monitoring device operates in a sleep mode (e.g. a mode which consumes minimal power, where the telematic monitoring device is primarily inactive and does not or cannot send wireless signals). During operation of the telematic monitoring device in the sleep mode, at 1932 in response to the telematic monitoring device receiving the first alert, the telematic monitoring device transitions to operate in an awake mode in which the telematic monitoring device is operable to send wireless signals. The telematic monitoring device then transmits a second alert to a remote device (e.g. by a wireless communication interface of the telematic monitoring device). In this way, the second alert can be actioned upon receipt by the remote device (e.g. by forwarding the second alert to another device, or by presenting the alert to an appropriate person).

As one example, the remote device could be a fleet management server. Upon receiving the second alert, the fleet management server could send a notification or alert to an available staff or support person, or to an emergency response team. Said persons could then act to prevent or mitigate damage or injury, or could contact appropriate persons or teams to do so (e.g. a governmental Fire Department). In some implementations, the fleet management server could reach out to third parties (such as a governmental Fire Department) automatically upon receiving the second alert, providing a location of the alert and an automatically generated or pre-prepared explanation of the situation.

As another example, the remote device could itself belong to a third party. For example, the telematic monitoring device could automatically send the second alert directly to a governmental Fire Department, with location information and an automatically generated or pre-prepared explanation of the situation.

If at 1924 the temperature of the battery does not exceed the first threshold, at 1928 the control circuitry transitions to operate in the low-power mode. At 1936, operation of the telematic monitoring device in the sleep mode is maintained. That is, if at 1924 the temperature of the battery is considered safe, the control circuitry of the battery device transitions back to the low-power mode without sending an alert to wake up the telematic monitoring device. This process can be repeated indefinitely, such that the battery device operates in a cycle where the control circuitry is operating in the low-power mode, and periodically transitions to the measurement mode to check battery temperature, then transitions back to the low-power mode if the battery temperature is within a safe threshold.

FIG. 20 is a flowchart diagram which illustrates another exemplary method 2000 of operating any of the battery devices and/or telematic monitoring devices described herein. Method 2000 as illustrated includes acts 1910, 2020, and 1930, as well as sub-acts 1912, 1922, 1924, 1926, 2022, 2024, 2026, 2028, 1928, 1932, 1934, and 1936. One skilled in the art will appreciate that additional acts could be added, acts could be removed, acts could be reordered, or acts could be combined as appropriate for a given application. For example, although method 2000 illustrates a decision tree, the order of decisions could be altered or the decisions could be made simultaneously. As another example, acts 1910, 2020, and 1930 generally express operation of the battery device or telematic monitoring device in certain modes; these acts could be expressed in combination with corresponding sub-acts 1912, 1922, 1924, 1926, 2022, 2024, 2026, 2028, 1928, 1932, 1934, and 1936 (e.g. 1910, 2020, or 1930 can be a state in which corresponding sub-acts are performed). The discussion of FIG. 20 is applicable to telematic monitoring device 210 and battery device 220 as discussed with reference to any of FIGS. 2, 3, 4, 5, 6, and 7, as well as battery device 800, 900, and 1000, and control circuitry 810, power circuitry 820, and the at least one battery 830 as discussed with reference to any of FIG. 8, 9, or 10. The description is also applicable to any battery device having a similar structure. Any such battery devices could include at least one non-transitory processor-readable storage medium having instructions stored thereon, wherein the instructions when executed by the control circuitry cause the battery device to perform appropriate acts of method 2000. Further, any appropriate telematic monitoring device could include at least one non-transitory processor-readable storage medium having instructions stored thereon, wherein the instructions when executed by at least one processor of the telematic monitoring device cause the telematic monitoring device to perform appropriate acts of method 2000.

Unless context dictates otherwise, the description of method 1900 in FIG. 19 is applicable to method 2000 in FIG. 20. For example, the discussion of acts 1910 and 1930, as well as sub-acts 1912, 1922, 1924, 1926, 1928, 1932, 1934, and 1936 in method 1900 is applicable to acts or sub-acts with the same reference numeral in method 2000. Further, the discussion of act 1920 in method 1900 is generally applicable to act 2020 in method 2000, but method 2000 adds additional sub-acts 2022, 2024, 2026, and 2028, discussed below.

In act 2020, if at 1924 the battery temperature does not exceed the first threshold, method 2000 proceeds to 2022. At 2022, the temperature of the battery of the battery device, as indicated in temperature data collected by the temperature sensor of the battery device, is compared to a second threshold lower than the first threshold. The second threshold is preferably set to correspond to a temperature which is abnormally high for normal operation of the battery, but is not high enough to indicate an overheating condition of the battery. As an example, for a first threshold set at 80° C., the second threshold could be set at 60° C., though any appropriate threshold values could be set. At 2024, a determination is made based on whether the temperature of the battery exceeds the second threshold. In some implementations, 2022 and 2024 could be combined or considered as a single act.

If the temperature of the battery exceeds the second threshold at 2024, the set period (in 1912) is set to a duration which is shorter than an initial duration of the set period. That is, the set period may initially be set as a first duration, and at 2026 the set period is set at a second duration shorter than the first duration. In an exemplary implementation, the first duration could be 5 minutes, and the second duration could be 1 minute. Subsequently, at 1928 the control circuitry of the battery device is transitioned to operate in the low-power mode.

Similar to as discussed with reference to method 1900 in FIG. 19, method 2000 can be repeated indefinitely, to provide periodic checks of battery temperature. However, when the set period is shortened at 2026, this will result in the control circuitry of the battery device being transitioned to operate in the measurement mode after a shorter amount of time than previously. That is, as a result of the comparisons and determinations at 1922, 1924, 2022, and 2024, if the temperature of the battery is below the first threshold but above the second threshold, temperature of the battery will be remeasured after a shorter time period than normal or by default. In this way, if the battery temperature is relatively high (above the second threshold), but not high enough to warrant sending an alert (higher than the first threshold), measurement of the battery temperature can be scheduled to be more frequent, to more quickly detect if the battery temperature does eventually exceed the first threshold. This advantageously reduces power consumption of battery temperature measurement, until a tangible risk is identified, at which point monitoring of the battery temperature is given higher priority (temperature measurement at greater frequency) in the interests of safety.

If at 2024 the temperature of the battery does not exceed the second threshold, the control circuitry is transitioned to operate in the low-power mode, without setting the set period to a duration shorter than an initial duration as in 2026. Instead, at 2028 the set period can optionally be reset to the initial duration as applicable, if the set period was previously set be shorter in 2026 (i.e. during a previous iteration of method 2000). Resetting the set period to an initial duration as in 2028 is optional in the sense that it is not necessarily performed in each implementation or iteration of method 2000.

In one example, once a particular battery has been measured as operating at an abnormally high temperature, said battery may be deemed to pose more risk than other batteries, and thus may be permanently subjected to more frequent temperature measurement.

In another example, once a battery has been measured as operating at an abnormally high temperature, it may be desirable to continue to measure the battery temperature at increased frequency until the battery has been demonstrated to operate at normal temperature for an extended period of time. To achieve this, in an exemplary implementation, even if the temperature of the battery no longer exceeds the second threshold at 2024, the set period may not be reset to an initial duration until the temperature of the battery has been measured to be below the second threshold for a set number of iterations (cycles) of method 2000. That is, if the temperature of the battery has not exceeded the second threshold for a set number of comparisons to the second threshold (e.g. with one comparison per iteration of method 2000), the set period can be reset to the initial or first duration per 2028. As one example, the set period may not be reset at 2028 until the battery temperature has been determined to be below the second threshold over 10 iterations of method 2000.

In another exemplary implementation, even if the temperature of the battery no longer exceeds the second threshold at 2024, the set period may not be reset to an initial duration until the temperature of the battery has been measured to be below the second threshold for an additional period of time longer than the set period. That is, if the temperature of the battery has not exceeded the second threshold for a long enough amount of time (regardless of number of iterations of method 2000), the set period can be reset to the initial or first duration per 2028. As one example, the set period may not be reset at 2028 until the battery temperature has been determined to be below the second threshold for an hour, multiples hours, a day, or even longer.

The discussion of FIGS. 19 and 20 references a sleep mode and an awake mode of a telematic monitoring device, and a low-power mode and a measurement mode of a battery device. However, these modes are not necessarily exclusive with the first mode, second mode, third mode, fourth mode, and fifth mode of the battery device discussed with reference to at least FIGS. 13, 14, 15, and 16 earlier. Rather, the modes discussed with reference to FIGS. 19 and 20 may operate with, or be common with, the modes discussed with reference to FIGS. 13, 14, 15, and 16. As one example, the fourth mode for the battery device discussed above could be harmonious with or correspond to the low-power mode of the battery device discussed with reference to FIGS. 19 and 20.

In addition to the battery device sending an alert, as discussed above, there are alternative ways to use the devices described herein in the interest of safety.

Figure 21:
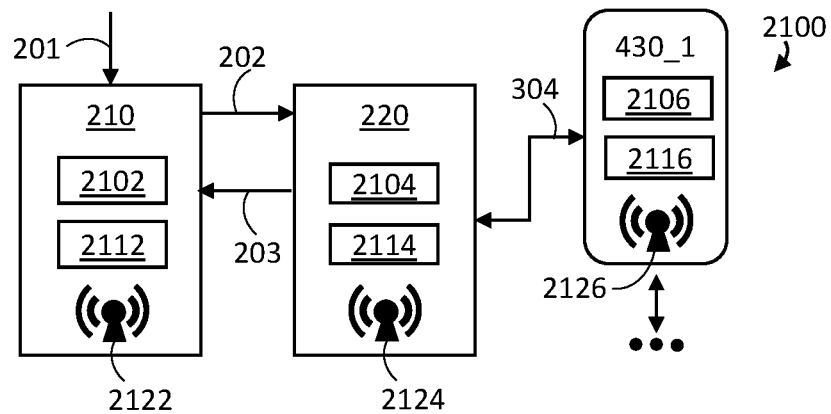
FIGS. 21 and 22 are schematic diagrams of respective telematic monitoring systems in accordance with at least two exemplary illustrated implementations.

FIG. 21 is a schematic diagram of an onboard telematic monitoring system 2100. Telematic monitoring system 2100 is similar to telematic monitoring systems 200, 300, 400, 500, 600, and 700 discussed earlier with reference to FIGS. 2, 3, 4, 5, 6, and 7, and description of telematic monitoring systems 200, 300, 400, 500, 600, and 700 applies to telematic monitoring system 2100 unless context dictates otherwise. Telematic monitoring system 2100 includes telematic monitoring device 210 and battery device 220, coupled by electrical pathways 202 and 203 similar to telematic monitoring system 200. Telematic monitoring system 2100 also optionally includes at least one peripheral device 430_1, electrically coupled to battery device 220 by electrical pathway 304, similar to telematic monitoring device 300. Further optionally, a plurality of peripheral devices could be included, and could be coupled in any appropriate manner similar to telematic monitoring systems 400, 500, 600, and 700.

One difference between telematic monitoring system 2100 in FIG. 21 and the other telematic monitoring systems described herein is that telematic monitoring system 2100 includes at least one emergency user interface. In particular, telematic monitoring device 210 is shown as including emergency user interface 2102, battery device 220 is shown as including emergency user interface 2104, and peripheral device 430_1 is shown as including emergency user interface 2106. Similar functionality can be achieved by any one of emergency user interfaces 2102, 2104, or 2106; each of emergency user interfaces 2102, 2104, and 2106 is not required (though it is possible to include all emergency user interfaces in a single implementation).

FIG. 21 also illustrates optional output devices 2112, 2114, and 2116 included in the respective telematic monitoring device 210, the battery device 220, and the peripheral device 430_1. Any of these output devices can be used to output confirmation of an emergency message, as is discussed in detail later. However, inclusion of output devices is optional, and similar functionality can be achieved by any one of output devices 2112, 2114, or 2116; each of output devices 2112, 2114, and 2116 is not required (though it is possible to include all output devices in a single implementation).

Further, FIG. 21 also shows telematic monitoring device 210 as including wireless communication interface 2122, battery device 220 is shown as including wireless communication interface 2124, and peripheral device 430_1 is shown as including wireless communication interface 2126. Similar functionality can be achieved by any one of wireless communication interfaces 2122, 2124, or 2126; each of wireless communication interfaces 2122, 2124, and 2126 is not required (though it is possible to include all wireless communication interfaces in a single implementation).

Emergency user interfaces 2102, 2104, and 2106 comprise a means by which a user can provide a simple input which indicates an emergency situation. In an exemplary use case, if the user (e.g. vehicle driver) is involved in a collision, the user can activate the emergency user interface to request for help. This could be useful for example if the user is trapped or otherwise unable to access or utilize another form of communication such as a cellular phone or radio device. In an exemplary implementation, the emergency user interfaces comprise a button or touch-interface to be pressed when the user identifies an emergency. In another exemplary implementation, the emergency user interfaces comprise an audio input device sensitive to specific keywords like "emergency", "ambulance", "police", or "help", as non-limiting examples.

Figure 22:
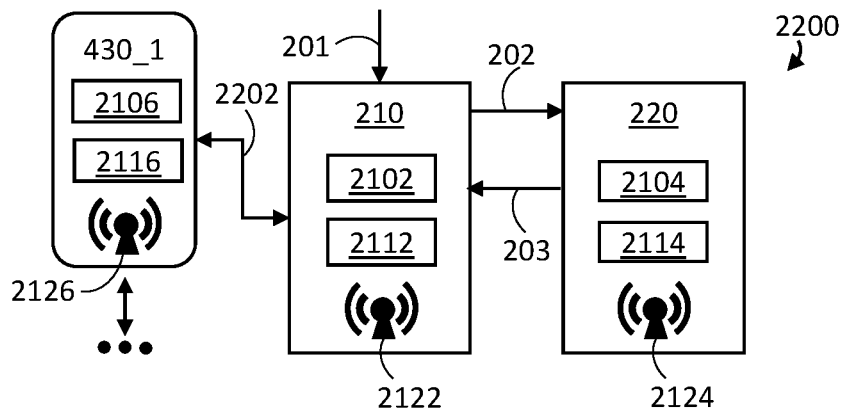

FIG. 22 shows a telematic monitoring system 2200 which is similar to telematic monitoring system 2100 in FIG. 21; description of FIG. 21 is applicable to FIG. 22 unless context dictates otherwise. Telematic monitoring system 2200 in FIG. 22 similarly shows emergency user interface by which a user can provide a simple input which indicates an emergency situation. One difference between telematic monitoring system 2200 and telematic monitoring system 2100 is that, in telematic monitoring system 2200, peripheral device 430_1 is electrically coupled to telematic monitoring device 210 by electrical pathway 2202, instead of to battery device 220 by electrical pathway 304 as in FIG. 21.

Figure 23:
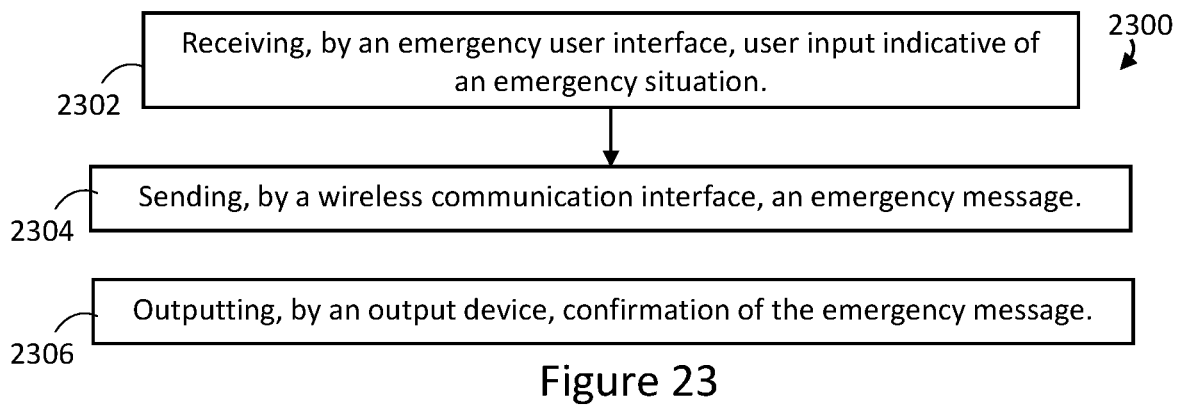
FIG. 23 is a flowchart diagram of a method of receiving emergency input and sending an emergency message, in accordance with an exemplary implementation.

FIG. 23 is a flowchart diagram which illustrates a method 2300 of operating a telematic monitoring system, such as telematic monitoring system 2100 in FIG. 21 or telematic monitoring system 2200 in FIG. 22. Method 2300 as illustrated includes acts 2302, 2304, and 2306. One skilled in the art will appreciate that additional acts could be added, acts could be removed, acts could be reordered, or acts could be combined as appropriate for a given application. For example, act 2306 is an optional act that could be removed as appropriate for a given application. Telematic monitoring device 210, battery device 220, and peripheral device 430_1 as shown in FIGS. 21 and 22 could each include at least one processor, and could include at least one non-transitory processor-readable storage medium having instructions stored thereon, wherein the instructions when executed by the respective processor cause the telematic monitoring system (or appropriate components thereof) to perform appropriate acts of method 2300.

At 2302, the emergency user interface receives user input indicative of an emergency situation. At 2304, in response to receiving the user input indicative of the emergency situation, a wireless communication interface of the telematic monitoring system sends an emergency message to be received by a remote device. Several examples are discussed below.

In a first exemplary case, with emergency user interface 2102 as included in telematic monitoring device 210, activation of the emergency user interface 2102 (as in 2302) causes at least one processor of the telematic monitoring device to generate or retrieve an emergency message, and causes wireless communication interface 2122 of the telematic monitoring device 210 to send the emergency message (as in 2304). For example, the at least one processor of the telematic monitoring device 210 can generate a message like "SOS received", and send this message as a high-priority alert to a remote device. The remote device could for example be a fleet management server to which the telematic monitoring device 210 generally reports. The remote device can then direct the message to an appropriate party (e.g. a service or emergency response team), who can take appropriate action (e.g. by sending an emergency response crew, or contacting a governmental emergency response team). Alternatively, the telematic monitoring device 210 could send the emergency message directly to a governmental emergency response body. Generally, this description of the nature of the emergency message, and recipients to which it can be sent, is applicable to all implementations of sending the emergency message discussed herein.

In a second exemplary case, with emergency user interface 2104 as included in battery device 220, activation of the emergency user interface 2104 (as in 2302) causes at least one processor or the control circuitry of battery device 220 to generate or retrieve an emergency message, and causes a communication interface of the battery device 220 to send the emergency message. In one example, the emergency message can be sent to telematic monitoring device 210, via electrical pathway 203. In response to receiving the emergency message, telematic monitoring device 210 can enter an awake mode (if it was in a sleep mode). Telematic monitoring device 210 can send (forward) the emergency message as received from battery device 220 to a remote device via wireless communication interface 2122 (as in 2304). Alternatively, at least one processor of telematic monitoring device 210 can generate or retrieve a different (e.g. more specific) emergency message to send to a remote device by wireless communication interface 2122 similar to as discussed above. In such cases, the concept of a device (e.g. battery device 220 or peripheral device 430_1) sending an emergency message to telematic monitoring device 210, and telematic monitoring device sending the emergency message to a remote device should not necessarily be interpreted strictly such that the identical message as received by the telematic monitoring device is sent to the remote device (although this interpretation is a possibility). In some cases, this scenario can encompass an additional act whereby the telematic monitoring device augments, modifies, or generates a new emergency message for sending to the remote device based on the emergency message received from the other device (battery device 220 or peripheral device 430_1)

In a third exemplary case, with emergency user interface 2104 as included in battery device 220, in response to activation of emergency user interface 2104 (as in 2302), the battery device 220 itself could send the emergency message to a remote device or entity by wireless communication interface 2124 (as in 2304), in a similar manner to as discussed above with reference to telematic monitoring device 210. The nature of the remote entity, and the specifics of the message sent thereto, can be similar to as discussed above regarding sending an emergency message by the telematic monitoring device 210.

In a fourth exemplary case, with emergency user interface 2106 as included in peripheral device 430_1, activation of the emergency user interface 2106 (as in 2302) causes at least one processor or control circuitry of peripheral device 430_1 to generate or retrieve an emergency message, and causes a communication interface of the peripheral device 430_1 to send the emergency message. In one example, the emergency message can be sent to telematic monitoring device 210 via battery device 220. In particular, the emergency message can be sent to battery device 220 by electrical pathway 304, then to telematic monitoring device 210 by electrical pathway 203, where the emergency message is sent to a remote device similarly to as discussed above regarding telematic monitoring device 210 (as in 2304). The emergency message can be sent as is (i.e. forwarded), or could be augmented, modified, or used as the basis for a different emergency message which is ultimately sent to a remote device by wireless communication interface 2122. Such augmentation, modification, or generation of a new emergency message could be performed by at least one processor of battery device 220 and/or by at least one processor of telematic monitoring device 210.

In a fifth exemplary case, with emergency user interface 2106 as included in peripheral device 430_1, in response to activation of emergency user interface 2106 (as in 2302), the emergency message can be sent to battery device 220 (e.g. via electrical pathway 304 in FIG. 21), for sending to a remote device or entity by wireless communication interface 2124 (as in 2304), similar to as discussed above.

In a sixth exemplary case, with emergency user interface 2106 as included in peripheral device 430_1, in response to activation of emergency user interface 2106 (as in 2302), the peripheral device 430_1 itself could send the emergency alert to a remote device or entity, by wireless communication interface 2126 (as in 2304), similar to as discussed above. The nature of the remote entity, and the specifics of the message sent thereto, can be similar to as discussed above regarding sending an emergency message by the telematic monitoring device 210.

In a seventh exemplary case, with emergency user interface 2106 as included in peripheral device 430_1, in response to activation of emergency user interface 2106 (as in 2302), the emergency message can be sent to telematic monitoring device 210 (e.g. via electrical pathway 2202 in FIG. 22), for sending to a remote device or entity by wireless communication interface 2124 (as in 2304), similar to as discussed above.

In some implementations, peripheral device 430_1 could be a dedicated emergency device. For example, peripheral device 430_1 could be a device having a button, coupled to battery device 220 by at least one wire or electrical pathway. Peripheral device 430_1 could be positioned in a convenient or easy to reach position in a vehicle, such as on a dash of the vehicle, even if telematic monitoring device 210 and/or battery device 220 are positioned in a difficult place to reach.

Advantageously, by including any of emergency user interfaces 2102, 2104, or 2106 in tandem with a battery backup (such as battery device 220), an emergency message can be sent even if a vehicle or connection is damaged such that telematic monitoring device 210 can no longer receive power from a vehicle. For example, in a collision, a vehicle battery could be destroyed, or a connection between telematic monitoring device 210 and vehicle power could be disrupted or severed. In such cases, the telematic monitoring device 210 may still be connected to battery device 220, which can provide power to enable sending of an emergency message.

As mentioned above, FIGS. 21 and 22 also illustrate output devices 2112, 2114, and 2116 included in the respective telematic monitoring device 210, the battery device 220, and the peripheral device 430_1. At 2306 in method 2300 illustrated in FIG. 3, any of these output devices can output confirmation of an emergency message. As examples of confirmation, such confirmation could include a confirmation that the user emergency input was received, confirmation that an emergency message was sent, or confirmation that a response to the emergency message was received and/or that help is on the way. As a specific example, any of wireless communication interfaces 2122, 2124, or 2126 could receive a response message from the remote device, which confirms that the emergency message was received by the remote device. The response message could further confirm action taken based on the emergency message. Such confirmation can help to ease the mind of the user. As examples of devices, output devices 2112, 2114, and 2116 can include an audio output device which outputs an audible confirmation, and/or output devices 2112, 2114, and 2116 can include visual output device which outputs a visual confirmation. In some implementations, devices 2112, 2114, or 2116 could include two-way audio input and audio output devices, which allow the user to provide additional information on the emergency. Such additional information could be sent as a message (for example to a remote device, or to an emergency response agency). In some implementations, any of devices 210, 220, or 230 could open a communication pipeline (e.g. a phone call or VOIP call) which allows the user to speak directly to a representative or emergency service person. Such a communication pipeline does not have to be directly established on the same device which includes the emergency user input interface. In an exemplary implementation, battery device 220 includes emergency user input interface 2104 and audio input and output device 2114, but does not include wireless communication interface 2124, whereas telematic monitoring device 210 does not include emergency user input 2102 or audio input or output device 2112 but includes wireless communication interface 2122. In such an implementation, in response to a user activating emergency user interface 2104, telematic monitoring device 210 can open a communication line (e.g. a cellular or VOIP call) by wireless communication interface 2122 thereof, and can provide access to this communication line to battery device 220. That is, battery device 220 can receive audio input from the user, and send this input to telematic monitoring device 210 for transmission to a recipient of the call. Likewise, telematic monitoring device 210 can receive audio from a recipient of the call, and send this audio to battery device 220 for output to the user.

While the present invention has been described with respect to the non-limiting embodiments, it is to be understood that the invention is not limited to the disclosed embodiments. Persons skilled in the art understand that the disclosed invention is intended to cover various modifications and equivalent arrangements included within the scope of the appended claims. Thus, the present invention should not be limited by any of the described embodiments.

Throughout this specification and the appended claims, infinitive verb forms are often used, such as "to operate" or "to couple". Unless context dictates otherwise, such infinitive verb forms are used in an open and inclusive manner, such as "to at least operate" or "to at least couple".

The specification includes various implementations in the form of block diagrams, schematics, and flowcharts. A person of skill in the art will appreciate that any function or operation within such block diagrams, schematics, and flowcharts can be implemented by a wide range of hardware, software, firmware, or combination thereof. As non-limiting examples, the various embodiments herein can be implemented in one or more of: application-specific integrated circuits (ASICs), standard integrated circuits (ICs), programmable logic devices (PLDs), field-programmable gate arrays (FPGAs), computer programs executed by any number of computers or processors, programs executed by one or more control units or processor units, firmware, or any combination thereof.

What is claimed is:
1. A system comprising:
a telematic monitoring device capable of obtaining data and power from a vehicle, the telematic monitoring device operable in a first plurality of modes including at least:
  a sleep mode where activity of the telematic monitoring device is limited; and
  an awake mode where the telematic monitoring device is operable to transmit a wireless signal; and
a battery device electrically coupled to the telematic monitoring device, the battery device including control circuitry, at least one battery, and at least one temperature sensor, the control circuitry operable in a second plurality of modes including at least:
  a low-power mode where the control circuitry is inactive; and
  a measurement mode where the control circuitry is operable to analyze temperature data from the temperature sensor,
wherein:
  during operation of the control circuitry in the low-power mode, the control circuitry of the battery device is operable to transition to operate in the measurement mode after a set period, where the set period is initially a first duration;
  during operation of the control circuitry in the measurement mode, the control circuitry is operable to;
    compare a first temperature of the battery indicated in the temperature data to a first threshold, and to send a first alert to the telematic monitoring device if the first temperature of the battery exceeds the first threshold; and compare the first temperature of the battery indicated in the temperature data to a second threshold lower than the first threshold; and if the first temperature of the battery is higher than the second threshold and below the first threshold, set the set period to a second duration shorter than the first duration and transition to operate in the low-power mode; and during operation of the telematic monitoring device in the sleep mode, the telematic monitoring device is operable to transmit a second alert to a remote device in response to the receiving the first alert from the battery device.

2. The system of claim 1, wherein during operation of the control circuitry in the measurement mode, the control circuitry is operable to transition to the low-power mode if the first temperature of the battery is less than the first threshold.

3. The system of claim 1, wherein the control circuitry is operable to, after setting the set period to the second duration and transitioning the control circuitry to operate in the low-power mode:

during operation of the control circuitry in the low-power mode, transition the control circuitry to operate in the measurement mode after the set period;

during operation of the control circuitry in the measurement mode, compare a second temperature of the battery indicated in the temperature data from the temperature sensor to the first threshold; and send the first alert to the telematic monitoring device if the second temperature of the battery exceeds the first threshold.

4. The system of claim 1, wherein the control circuitry is operable to, after setting the set period to the second duration and transitioning the control circuitry to operate in the low-power mode:

during operation of the control circuitry in the low-power mode, transition the control circuitry to operate in the measurement mode after the set period;

during operation of the control circuitry in the measurement mode, compare a second temperature of the battery indicated in the temperature data from the temperature sensor to the second threshold;

if the second temperature of the battery is below the second threshold, reset the set period to the first duration.

5. The system of claim 1, wherein the control circuitry is operable to, after setting the set period to the second duration and transitioning the control circuitry to operate in the low-power mode:

during operation of the control circuitry in the low-power mode, transition the control circuitry to operate in the measurement mode after the set period;

during operation of the control circuitry in the measurement mode, compare a second temperature of the battery indicated in the temperature data from the temperature sensor to the second threshold;

if the second temperature of the battery is below the second threshold, transition the control circuitry to operate in the low-power mode; and if temperature of the battery has not exceeded the second threshold for a set number of comparisons to the second threshold, reset the set period to the first duration.

6. The system of claim 1, wherein the control circuitry is operable to, after setting the set period to the second duration and transitioning the control circuitry to operate in the low-power mode:

during operation of the control circuitry in the low-power mode, transition the control circuitry to operate in the measurement mode after the set period;

during operation of the control circuitry in the measurement mode, compare a second temperature of the battery indicated in the temperature data from the temperature sensor to the second threshold;

if the second temperature of the battery is below the second threshold, transition the control circuitry to operate in the low-power mode; and if temperature of the battery has not exceeded the second threshold for an additional period longer than the set period, reset the set period to the first duration.

\* \* \* \* \*